US009456509B2

(12) United States Patent
Tsukahara

(10) Patent No.: US 9,456,509 B2
(45) Date of Patent: Sep. 27, 2016

(54) STRUCTURE FOR HOLDING DISPLAY MODULE

(71) Applicant: Rei Tsukahara, Tokyo (JP)

(72) Inventor: Rei Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 149 days.

(21) Appl. No.: 14/412,711

(22) PCT Filed: Sep. 25, 2012

(86) PCT No.: PCT/JP2012/074496
§ 371 (c)(1),
(2) Date: Jan. 5, 2015

(87) PCT Pub. No.: WO2014/049680
PCT Pub. Date: Apr. 3, 2014

(65) Prior Publication Data
US 2015/0146350 A1    May 28, 2015

(51) Int. Cl.
*G02F 1/1333* (2006.01)
*F21V 7/04* (2006.01)
*H05K 5/00* (2006.01)
*B60R 11/02* (2006.01)
*H05K 5/02* (2006.01)
*H04N 5/64* (2006.01)
*B60R 11/00* (2006.01)

(52) U.S. Cl.
CPC ......... *H05K 5/0017* (2013.01); *B60R 11/0235* (2013.01); *G02F 1/133308* (2013.01); *H04N 5/64* (2013.01); *H05K 5/0004* (2013.01); *H05K 5/0221* (2013.01); *B60R 2011/0075* (2013.01)

(58) Field of Classification Search
CPC .................. B60R 11/0235; B60R 2011/0075; H05K 5/0221; H05K 5/0017; H05K 5/0004
USPC ............................................ 349/58; 362/633
See application file for complete search history.

(56) References Cited

U.S. PATENT DOCUMENTS

| 8,836,881 | B2* | 9/2014 | Tanaka | G02F 1/133308 349/58 |
| 2003/0030765 | A1* | 2/2003 | Hayashi | G02F 1/133308 349/65 |
| 2010/0188597 | A1 | 7/2010 | Koike et al. | |
| 2010/0321593 | A1* | 12/2010 | Kunii | G02F 1/133604 348/790 |

FOREIGN PATENT DOCUMENTS

| JP | 11-7000 A | 1/1999 |
| JP | 11-160685 A | 6/1999 |
| JP | 2000-112387 A | 4/2000 |

(Continued)

*Primary Examiner* — Hoan C Nguyen
(74) *Attorney, Agent, or Firm* — Birch, Stewart, Kolasch & Birch, LLP

(57) ABSTRACT

Provided is a structure for holding a display module, including: a display module; a housing member that is a box-like member which houses the display module, has openings in a surface facing a display surface of the display module housed therein, and has locking holes in side surface parts; and a plate-like member that is a plate-like one which is arranged on a rear surface of the display module housed in the first member, has engagement claws that protrude outward on an edge side part and has on a plane part elastic holding pieces which press the display module from the rear surface side, and locks the engagement claws fitted in the locking holes by reaction force of pressing by the elastic holding pieces.

4 Claims, 20 Drawing Sheets

(56) References Cited

FOREIGN PATENT DOCUMENTS

| JP | 2004-109734 A | 4/2004 |
| JP | 2006-38993 A | 2/2006 |
| JP | 2007-232812 A | 9/2007 |
| WO | WO 2009/034670 A1 | 3/2009 |

* cited by examiner (a)

(b)

(a)

(b)

(c)

(a)

(b)

(a)

(b)

(a)

(b)

(a)

(b)

(c)

(d)

(a)

(b)

STRUCTURE FOR HOLDING DISPLAY MODULE

TECHNICAL FIELD

The present invention relates to a structure for holding a display module in a housing of a display apparatus.

BACKGROUND ART

For example, Patent Document 1 discloses a display apparatus that is configured from a box-shaped support (referred to as a rear case) which houses a display module including a light source holder and a liquid crystal display panel, and has one surface opened, and a box-shaped support (referred to as a front case) which similarly has one surface opened, and is provided with a window on a surface facing the opened surface.

This display apparatus has a structure that performs assembly by fitting an opening of the front case to an opening of the rear case. In addition, on the bottom of the rear case, an elastic protrusion that urges the display module toward the front case is provided, and claw protrusions are formed at a peripheral side part of the elastic protrusion. At a peripheral side part of the front case, claw lock parts each formed by cutting out a part thereof are provided.

When the front case is assembled to the rear case, and the claw protrusions are fitted to the claw lock parts, the whole display module is urged toward the inner surface of the window by an elastic force of the elastic protrusion, thereby pressing up the front case. Consequently, inner wall parts of the claw lock parts are in a state urged in a direction to be hooked on the claw protrusions.

CITATION LIST

Patent Document

Patent Document 1: Japanese Patent Application Laid-open No. 2000-112387

SUMMARY OF THE INVENTION

Problems to be Solved by the Invention

A conventional technology represented by Patent Document 1 has a problem that assembly workability is poor, since the box-shaped supports are assembled to each other.

For example, in a case where the claw protrusions provided on the respective facing side surfaces of the rear case are fitted to the corresponding claw lock parts of the front case, the front case is made to coincide with the opening of the rear case and pressed into the opening at once. At this time, the claw protrusions are slid on the inner walls of the front case until the claw protrusions are fitted to the claw lock parts. In accordance with this, the facing both side surfaces of the front case are bent so as to be opened outward.

The force of bending the side surfaces increases in proportion to the protruding degrees of the claw protrusions, and therefore, in a case where it is attempted to ensure assembly stability by increasing the protruding degrees of the claw protrusions, large force for pressing the front case in the rear case is required, and assembly work becomes difficult.

On the other hand, in a case where assembly workability is emphasized and the protruding degrees of the claw protrusions are lowered, there is a possibility that the claw protrusions easily come off from the claw lock parts with external force applied to the case.

Additionally, in a case where force of pressing the side surfaces in the inner direction of the case, or vibration of bending the case side surfaces inward and outward alternately is applied, when the key-shaped (hook-shaped) claw protrusions are located on the outside of the side surfaces of the rear case like Patent Document 1, and the side surfaces of the rear case are bent inward, there is a high possibility that the claw protrusions come off from the claw lock parts with this bending.

Furthermore, in Patent Document 1, the both supports each need to be formed in a box-shape, and therefore, there is a possibility that the number of work steps such as bending work of plate materials increases, and a manufacturing process becomes complicated. In a case where the bending accuracy of the plate materials for forming the both side surfaces of the rear and front cases is not proper, there is a possibility that reliability of the engagement of the claw protrusions and the claw lock parts are greatly lowered.

The present invention has been made in order to solve the foregoing problems, and an object of the invention is to obtain a structure for holding a display module having excellent assembly workability, and capable of improving reliability of holding the display module.

Means for Solving the Problems

A structure for holding a display module according to the present invention includes: a display module; a first member that is a box-like member which houses the display module, has an opening in a surface facing a display surface of the display module housed therein, and has a locking hole in a side surface part; a second member that is a plate-like member which is arranged on a rear surface of the display module housed in the first member, has an engagement claw that protrudes outward on an edge side part and has on a plane part an elastic holding piece which presses the display module from a rear surface side, and locks the engagement claw that is fitted in the locking hole by reaction force of pressing by the elastic holding piece; and a box-like third member that covers the second member housed in the first member, and a peripheral side part of the first member, wherein the locking hole is a slit that is opened to an end surface of the side surface part of the first member, and the third member has on a side surface part a coming-off prevention piece that prevents coming-off of the engagement claw by being further fitted in the slit in which the engagement claw has been fitted and locked.

Effect of the Invention

According to the present invention, there is an advantageous effect that achieves excellent assembly workability and improved reliability of holding the display module.

MODES FOR CARRYING OUT THE INVENTION

Hereinafter, modes for carrying out the present invention will be described with reference to the attached figures in order to more specifically describe the present invention.
Embodiment 1.

Figure 1:
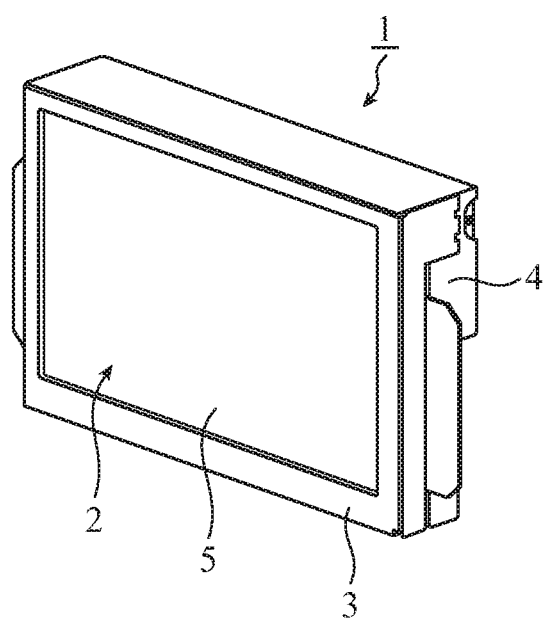
FIG. 1 is a figure showing a display apparatus to which a structure for holding a display module according to the present invention is applied.

FIG. 1 is a figure showing a display apparatus to which a structure for holding a display module according to the present invention is applied. A display apparatus 1 is applied to, for example, an on-vehicle information processor such as a navigation device, or an audio device with a display. As shown in FIG. 1, the display apparatus 1 is constituted by including a housing member 3 that houses a display module 2, and a box-like member 4. A display surface 5 of the display module 2 is exposed from an opening of the housing member 3 to the outside. In addition, the box-like member 4 is a member that covers the rear surface side of the housing member 3, and the peripheral side part of the housing member 3. The box-like member 4 will be later described in Embodiment 3.

Figure 2:
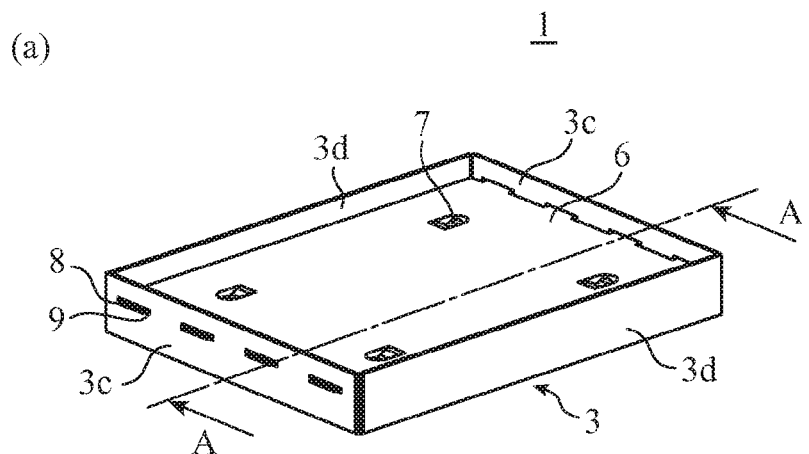
FIG. 2 is a set of figures each showing a structure for holding a display module according to Embodiment 1 of the present invention.
Figure 2:
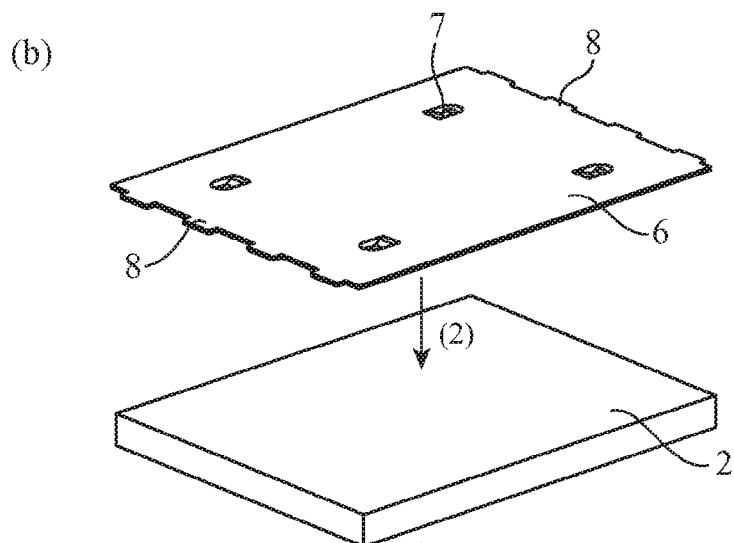
Figure 2:
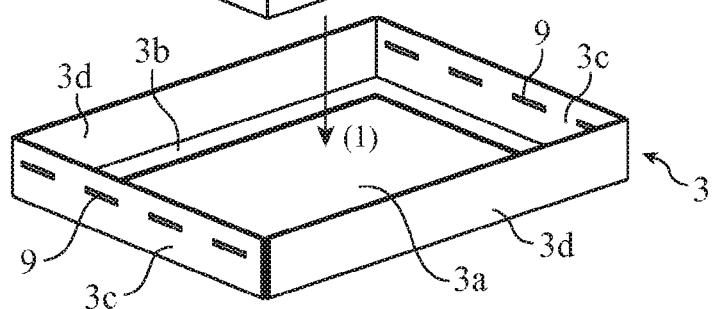
Figure 2:
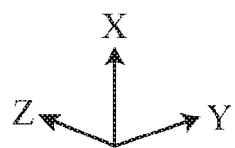

FIG. 2 is a set of figures each showing a structure for holding a display module according to Embodiment 1 of the present invention. FIG. 2(a) is a perspective view showing a display module holding structure of a display apparatus, and FIG. 2(b) is an exploded perspective view of the structure of FIG. 2(a).

The display module 2 is housed in the housing member 3 as shown in FIG. 2(b). Additionally, the display module 2 is configured from a liquid crystal panel, a plasma panel, an organic EL (electroluminescence), or the like. For example, in a case where the display apparatus to which the structure for holding a display module according to the present invention is applied is a liquid crystal display apparatus, the display module 2 is configured by modularizing components required for liquid crystal display such as a liquid crystal display panel, a liquid crystal display driver circuit, and a backlight.

The housing member 3 is a box-like member that houses the display module 2 as shown in FIG. 2(a). Additionally, the housing member 3 is formed with an opening 3a in a surface facing the display surface of the display module 2 housed therein, formed with a flange surface 3b in the peripheral edge of the opening, and further formed with locking holes 9 in facing side surface parts 3c (side surface parts facing in an Y axis direction) respectively, as shown in FIG. 2(b). The locking holes 9 are oblong slits formed by boring the side surface parts 3c. In the example shown in FIG. 2(b), the four locking holes 9 are formed in the one side surface part 3c.

A plate-like member 6 is arranged on the rear surface of the display module 2 housed in the housing member 3, as shown in FIG. 2(b). Additionally, in a plane part of the plate-like member 6, elastic holding pieces 7 are formed. In the example of FIG. 2(a), the elastic holding pieces 7 are arranged in four corners of the plane part of the rectangular plate-like member 6.

Furthermore, the plate-like member 6 is formed with engagement claws 8 on one of pairs of facing edge sides (respective edge sides facing the side surface parts 3c). The engagement claws 8 are oblong plate-like parts that extend from the edge sides.

Note that in the example shown in FIG. 2(b), the four engagement claws 8 are formed in the one edge side.

In the structure for holding a display module according to the present invention, the display module 2 is arranged in the housing member 3 (Step (1) of FIG. 2(b)). At this time, the peripheral edge part of the display surface of the display module 2 is supported by the flange 3b. Then, the side surface parts 3c of the housing member 3 are bent outward, and the engagement claws 8 are fitted in the locking holes 9 (Step (2) of FIG. 2(b)).

Consequently, the elastic holding pieces 7 press the display module 2 from the rear surface side along an X axis direction, the engagement claws 8 fitted in the locking holes 9 are locked by reaction force of this pressing, and the display module 2 is held in the housing member 3.

Figure 3:
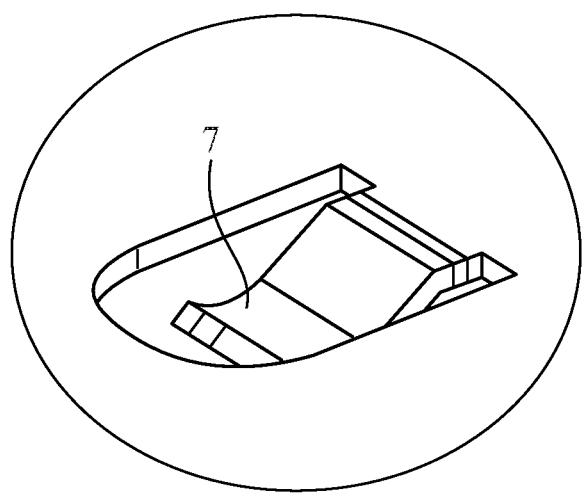
FIG. 3 is an enlarged view showing an elastic holding piece of FIG. 2.

FIG. 3 is an enlarged view showing the elastic holding piece of FIG. 2. As shown in FIG. 3, each elastic holding piece 7 is a claw part formed by bending the plane part of the plate-like member 6 to the rear surface side of the display module 2. The distal end of the elastic holding piece 7 is curved, and is in contact with the rear surface of the display module 2 at a position corresponding to an inflection point thereof.

Figure 4:
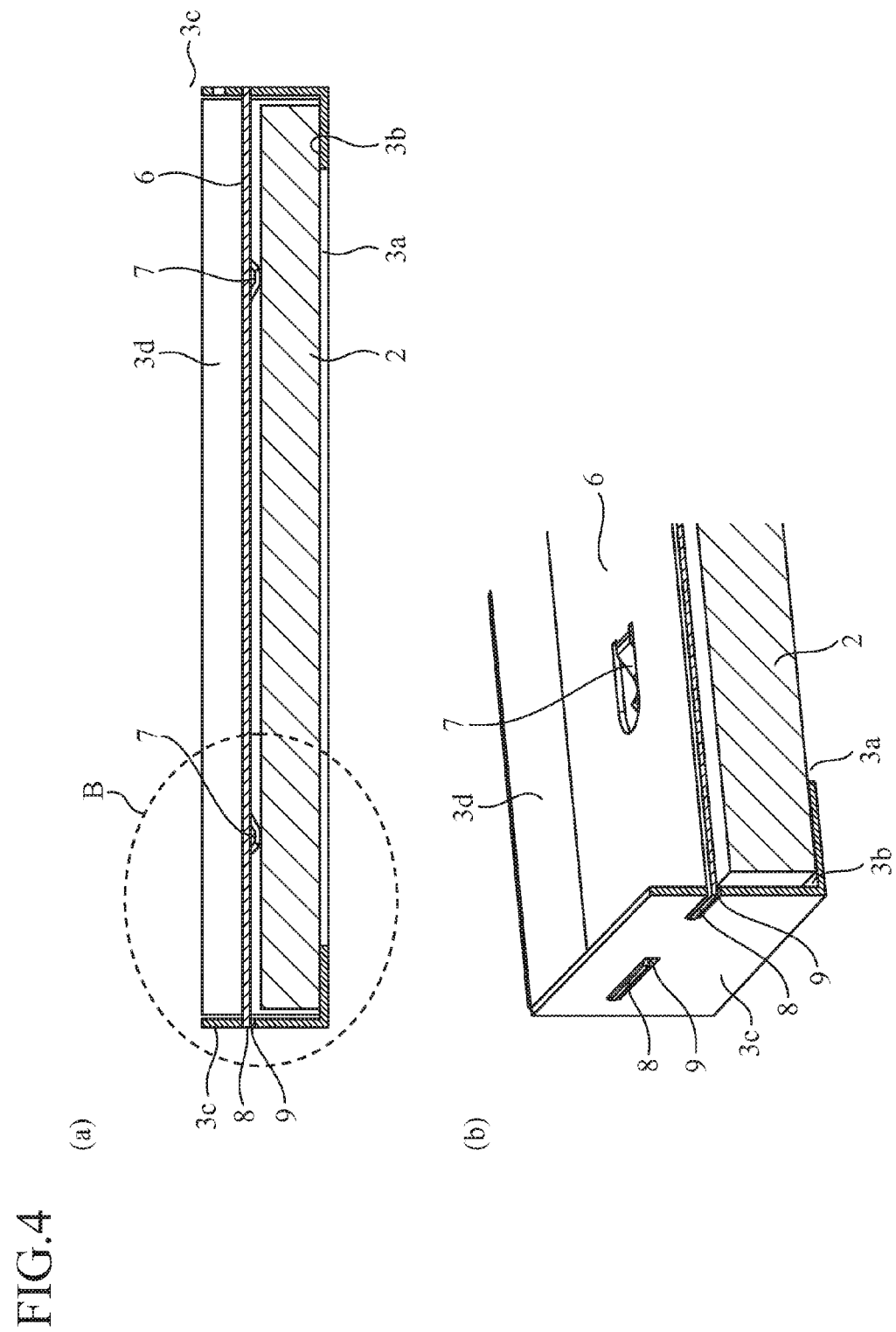
FIG. 4 is a set of sectional views taken along a line A-A of FIG. 2(a).

FIG. 4 is a set of sectional views taken along a line A-A of FIG. 2(*a*): FIG. 4(*a*) is a sectional view taken along the line A-A as viewed along arrows; and FIG. 4(*b*) is an enlarged perspective view of a portion B of FIG. 4(*b*). As shown in FIG. 4(*a*), in the structure for holding a display module according to Embodiment 1, the plate-like member 6 is housed in the housing member 3, and has no portion that directly receives external force. As shown in FIG. 4(*b*), the engagement claws 8 protrude in the outward direction of the housing member 3 to be fitted in the locking holes 9. Therefore, even when external force of pressing the side surface parts 3*c* inward is applied, the side surface parts 3*c* are simply bent in a direction in which the engagement claws 8 are fitted in the locking holes 9, and the fitting and locking between the engagement claws 8 and the locking holes 9 are not easily released.

Furthermore, the end surfaces of the edge side parts provided with the engagement claws 8 serve as abutting surfaces, and regulate the inward bending of the side surface parts 3*c*. Consequently, it is possible to improve resistance against the external force of pressing the side surface parts 3*c* inward.

Figure 5:
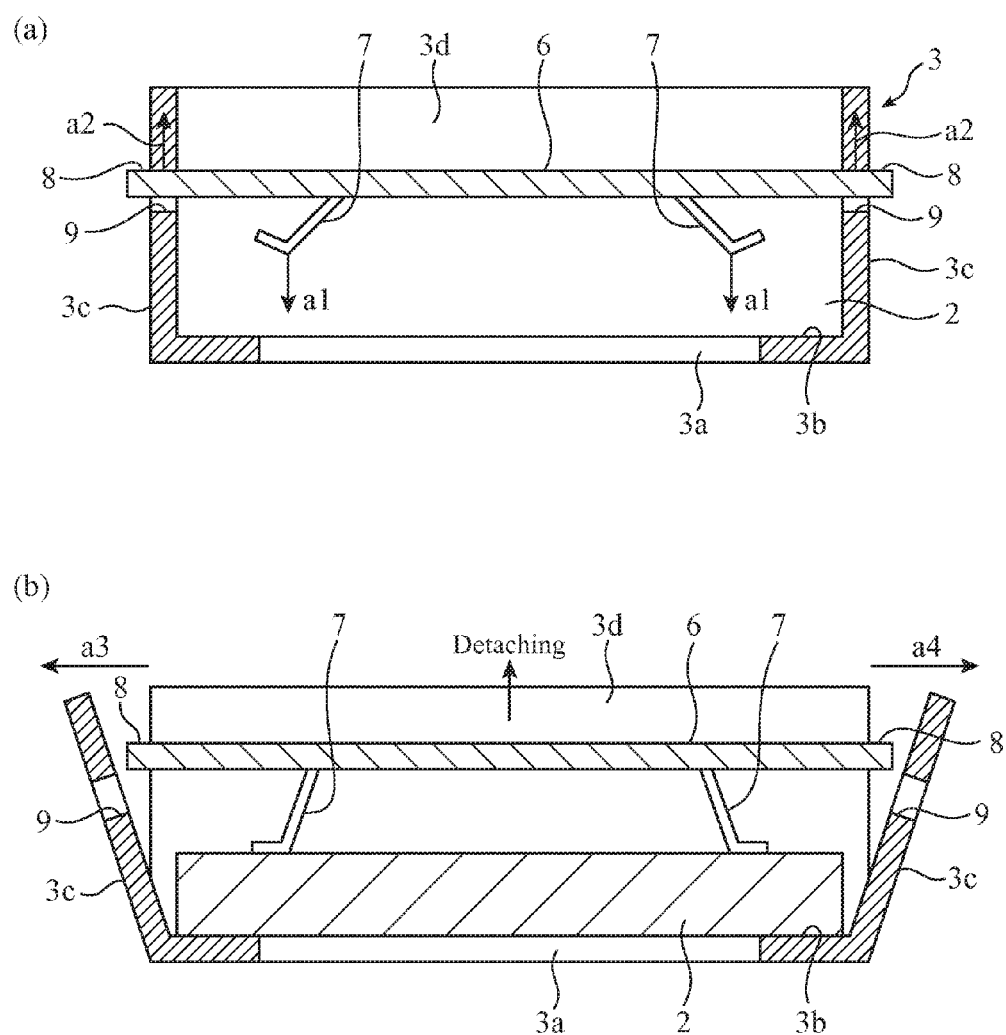
FIG. 5 is a set of figures showing an outline of holding release of the structure for holding a display module according to Embodiment 1.

FIG. 5 is a set of figures showing an outline of holding release of the structure for holding a display module according to Embodiment 1. FIG. 5(*a*) is a figure schematically showing the cross section of FIG. 4(*a*), and FIG. 5(*b*) is a figure schematically showing a detaching mode of the plate-like member in FIG. 5(*a*). As shown in FIG. 5(*a*), the elastic holding pieces 7 of the plate-like member 6 press the rear surface side of the display module 2 in a direction a1, and the engagement claws 8 press the inner wall parts of the locking holes 9 in a direction a2 by the reaction force, to be locked.

That is, in the structure for holding a display module according to Embodiment 1, the plate-like member 6 is fixed to the housing member 3 by reaction force in an opposite direction (direction a2) to pressing force in the direction a1 of the elastic holding pieces 7 that is force of holding the display module 2.

In order to detach the plate-like member 6 from the housing member 3, it is necessary to apply force in a direction different from the direction (direction a2) of force of fixing the plate-like member 6 to the housing member 3 to the side surface parts 3*c* to bend the side surface parts 3*c*.

That is, as shown in FIG. 5(*b*), the side surface parts 3*c* are bend outward (in the direction a3 and the direction a4), and the fitting between the engagement claws 8 and the locking holes 9 is released. With such a configuration, even when the external force of pressing the side surface parts 3*c* inward is applied, the plate-like member 6 is not easily detached from the housing member 3, and assembly reliability in an actual use environment can be improved.

Figure 6:
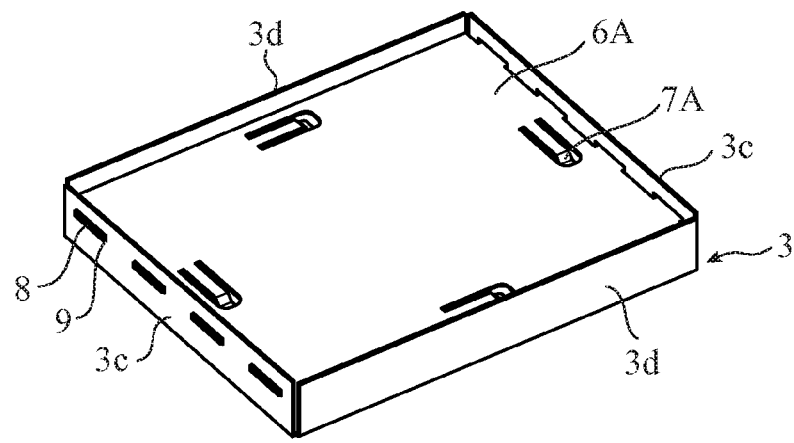
FIG. 6 is a figure showing another example (Example 1) of the structure for holding a display module according to Embodiment 1.
Figure 7:
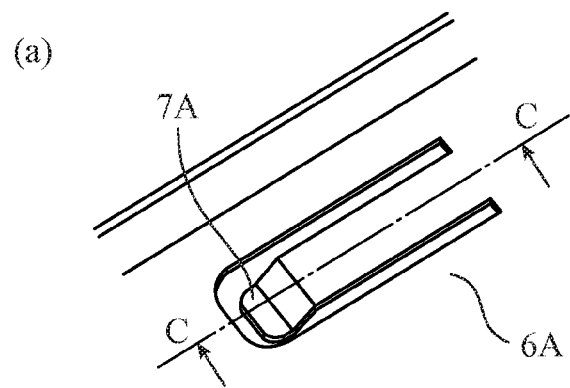
FIG. 7 is a set of enlarged views of an elastic holding piece of FIG. 6.
Figure 7:
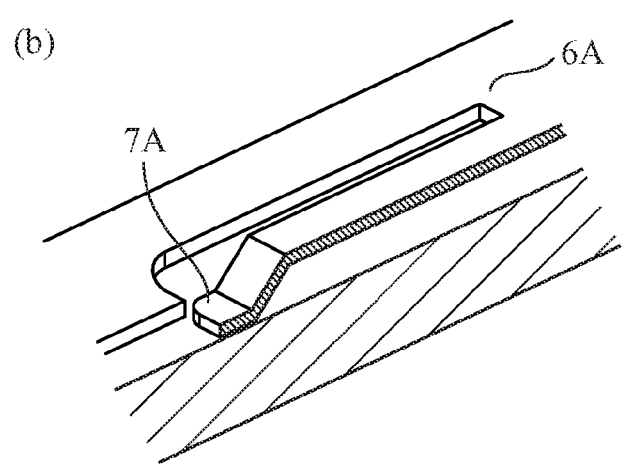

FIG. 6 is a figure showing another example (Example 1) of the structure for holding a display module according to Embodiment 1. Also, FIG. 7 is a set of enlarged views of an elastic holding piece of FIG. 6: FIG. 7(*a*) is an enlarged top view; and FIG. 7(*b*) is a sectional view taken along a line C-C of FIG. 7(*a*) as viewed along arrows. In the structure shown in FIG. 6, unlike FIG. 2, each elastic holding piece 7A is arranged at a position along an edge side of a plane part of a rectangular plate-like member 6A (central position of the edge side).

Note that in the present invention, the arrangement places of the elastic holding pieces in the plane part of the plate-like member, and the number of the arranged elastic holding pieces are not limited. That is, in addition to the four corners of the plane part, and the central position of each edge side, a plurality of the elastic holding pieces may be provided along the one edge side, or the elastic holding piece may be provided at the center of the plane part, or around the center.

However, there is a possibility that, when the rear surface side of the display surface such as the central part of the rear surface of the display module 2 is strongly pressed, such strong press affects the display performance of the display module 2 (such as the distortion of an image).

Therefore, the areas of portions, in contact with the display module 2, of the elastic holding pieces 7 are desirably reduced, and the elastic holding pieces 7 are desirably provided such that a portion of the rear surface side corresponding to the peripheral edge part (frame portion) of the display surface of the display module 2 is pressed. With such a configuration, the peripheral edge part of the display surface of the display module 2 is narrowed, and the display surface can be widened. Consequently, it is possible to reduce the size of the entire of the display module 2 while maintaining the size of the display surface.

As shown in FIG. 7(*a*), each elastic holding piece 7A is a claw part formed by cutting and bending the plane part of the plate-like member 6A, has a beam portion longer than that of the elastic holding piece 7, and has high elastic force. Additionally, as shown in FIG. 7(*b*), the distal end of the elastic holding piece 7A is formed in a plane shape, and the plane distal end is in contact with the rear surface of the display module 2. Note that in the present invention, the structure of the elastic holding piece is not limited to those of the pieces shown in FIG. 3 and FIG. 7; the structure may be employed as long as it provides elastic force enabling press from the rear surface of the display module 2.

Figure 8:
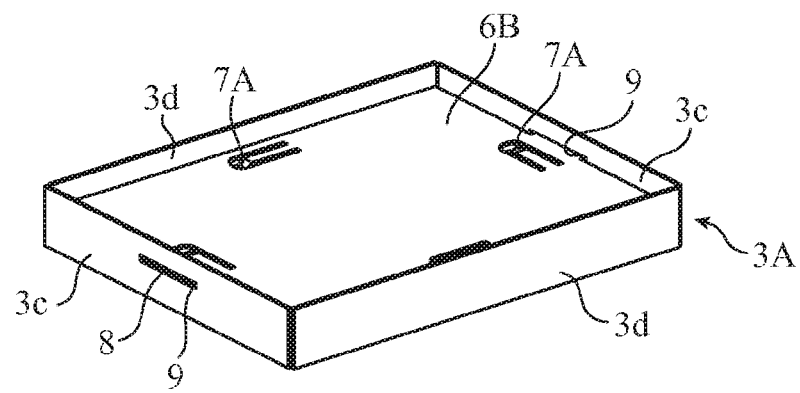
FIG. 8 is a set of figures each showing another example (Example 2) of the structure for holding a display module according to Embodiment 1.
Figure 8:
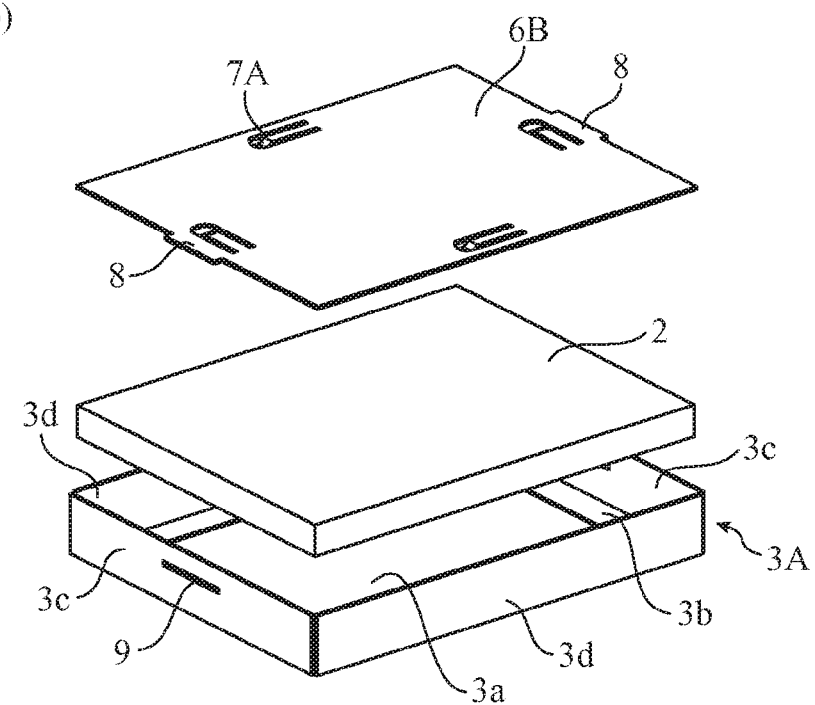

FIG. 8 is a set of figures each showing another example (Example 2) of the structure for holding a display module according to Embodiment 1. FIG. 8(*a*) is a perspective view showing a display module holding structure of Example 2, and FIG. 8(*b*) is an exploded perspective view of the structure of FIG. 8(*a*). As shown in FIG. 8(*b*), in a plate-like member 6B, engagement claws 8 are formed on one of pairs of facing edge sides (respective edge sides facing side surface parts 3*c*) one by one. Also, as shown in FIG. 8(*a*), in a housing member 3A, a locking hole 9 is formed on each of the facing side surface parts 3*c*. Thus, the size of the engagement claw and the size of the locking hole are increased, so that the stability of fitting and locking between the engagement claws and the locking holes may be improved.

Figure 9:
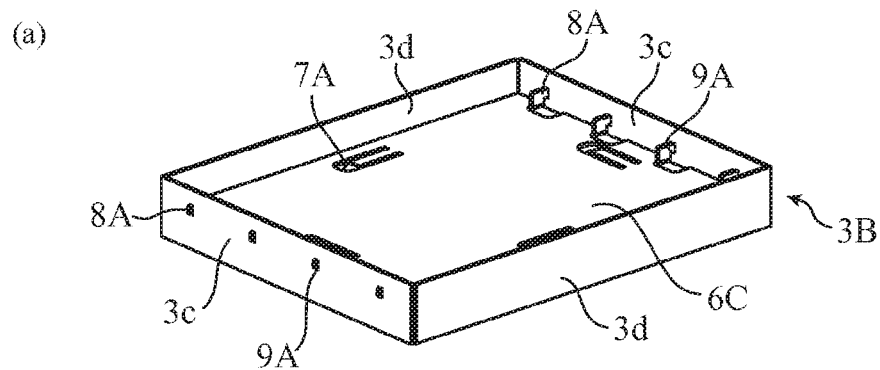
FIG. 9 is a set of figures each showing another example (Example 3) of the structure for holding a display module according to Embodiment 1.
Figure 9:
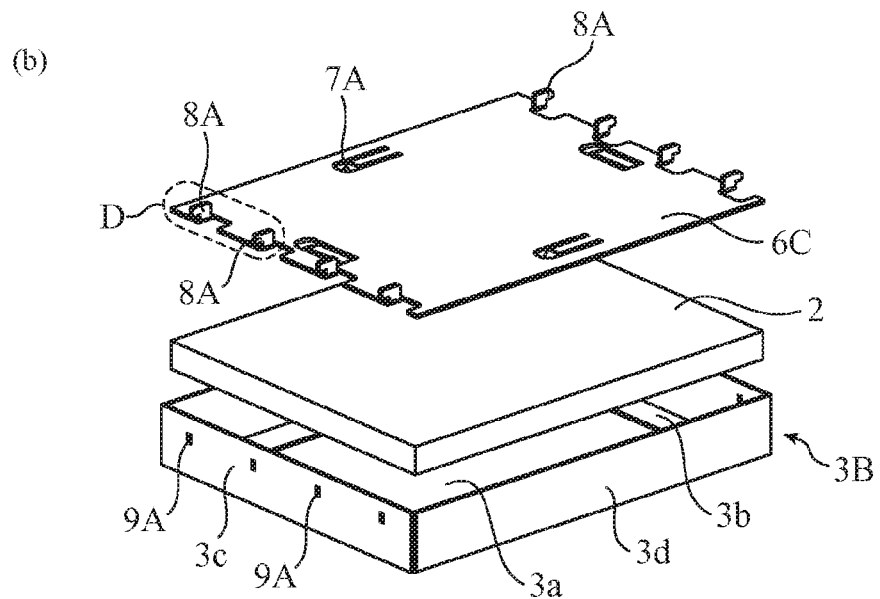
Figure 9:
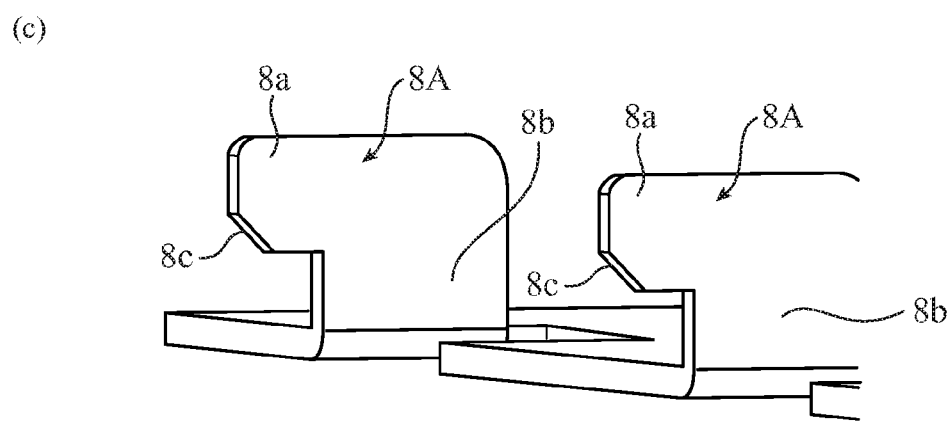
Figure 10:
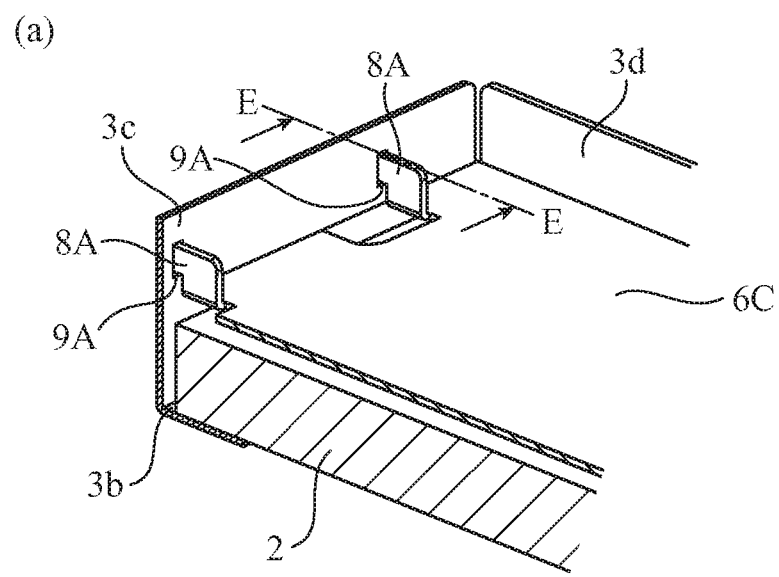
FIG. 10 is a set of figures each showing a connection mode by an engagement claw of FIG. 9.
Figure 10:
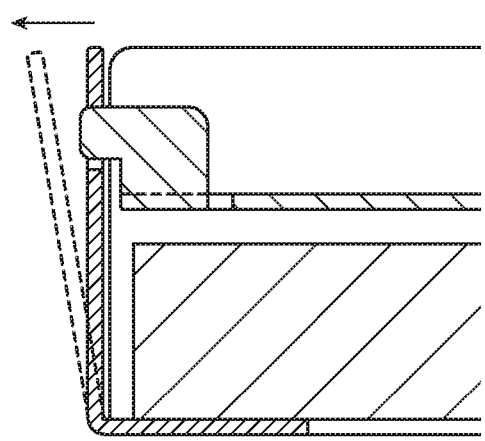

FIG. 9 is a set of figures each showing another example (Example 3) of the structure for holding a display module according to Embodiment 1: FIG. 9(*a*) is a perspective view showing a display module holding structure of Example 3; FIG. 9(*b*) is an exploded perspective view of a structure of FIG. 9(*a*); and FIG. 9(*c*) is an enlarged view of a portion D of FIG. 9(*b*). FIG. 10 is a set of figures each showing a connection mode by an engagement claw of FIG. 9: FIG. 10(*a*) is a perspective view showing the connection mode of the engagement claw as viewed from the plate-like member side; and FIG. 10(*b*) is a sectional view taken along a line E-E of FIG. 10(*a*) as viewed along arrows.

As shown in FIG. 9(*b*) and FIG. 9(*c*), a plate-like member 6C is provided with engagement claws 8A on respective edge side facing side surface parts 3*c*. The engagement claws 8A are formed by cutting and raising the edge side parts of the plate-like member 6C in a longitudinal direction, and have plate-like parts 8*a*, and bases 8*b* connected to the plane part of the plate-like member 6C.

As shown in FIG. 9(*a*), the housing member 3B is provided with locking holes 9A in the facing side surface parts 3c. The locking holes 9A are longitudinal slits allowing the fitting and locking of the engagement claws 8A.

As shown in FIG. 10(a), the plate-like parts 8a of engagement claws 8A protruding outward are fitted into the locking holes 9A. Note that similarly to the case of the engagement claws 8 and the locking holes 9, as shown in FIG. 10(b), the side surface parts 3c of the housing member 3B are bent outward, and the plate-like member 6C is arranged on the rear surface of a display module 2, so that the engagement claws 8A can be fitted in the locking holes 9A. At this time, the end surfaces, close to the side surface parts 3c, of the bases 8b of the engagement claws 8A serve as abutting surfaces along with the end surfaces of the edge sides (edge sides provided with the engagement claws 8A) of the plate-like member 6C, thereby regulating the inward bending of the side surface parts 3c. Consequently, it is possible to improve resistance against external force of pressing the side surface parts 3c inward.

In addition, as shown in FIG. 9(c), the plate-like parts 8a of the engagement claws 8A which protrude outward may be provided with guide surfaces 8c formed by trimming the corners to be tapered. The guide surfaces 8c guide the plate-like parts 8a to openings of the locking holes 9A, and therefore it is possible to improve the assemblability of the plate-like member 6C to the housing member 3B.

Figure 11:
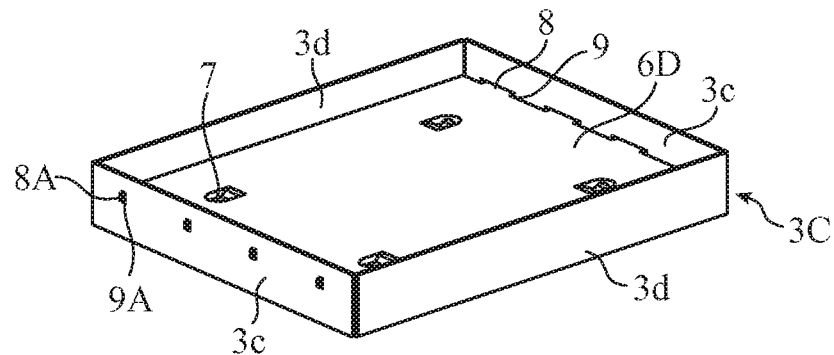
FIG. 11 is a set of figures each showing another example (Example 4) of the structure for holding a display module according to Embodiment 1.
Figure 11:
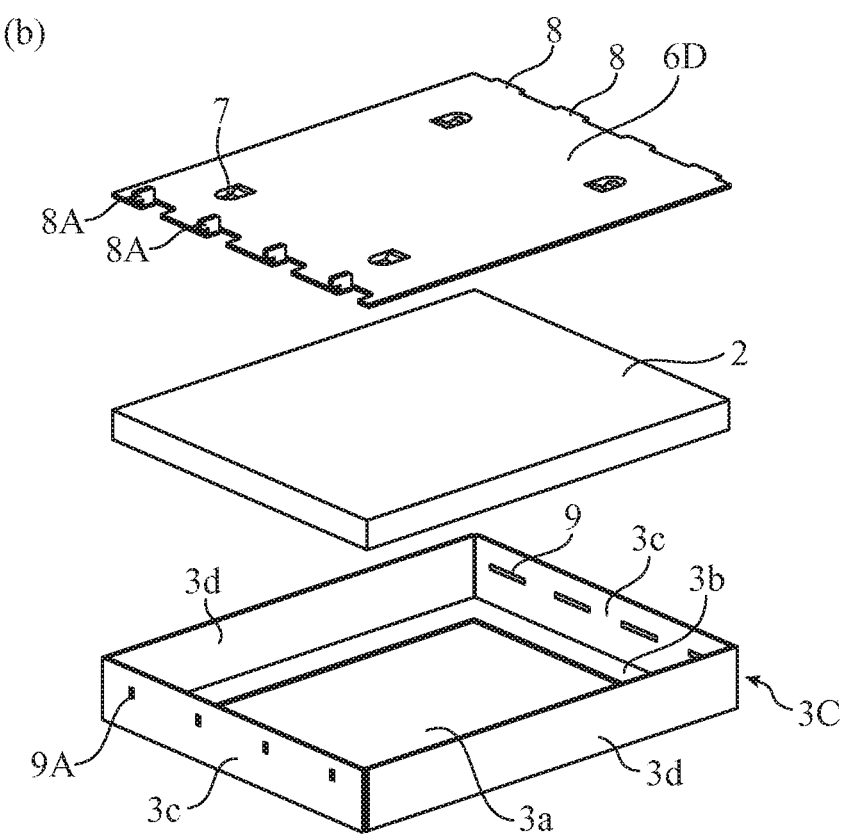

FIG. 11 is a set of figures each showing another example (Example 4) of the structure for holding a display module according to Embodiment 1. FIG. 11(a) is a perspective view showing a display module holding structure of Example 4, and FIG. 11(b) is an exploded perspective view of the structure of FIG. 11(a). As shown in FIG. 11(b), a plate-like member 6D is provided with engagement claws 8 in one of the facing edge sides of side surface parts 3c, and provided with engagement claws 8A in the other edge side. Also, the housing member 3C is provided with locking holes 9 in one of the side surface parts 3c, and provided with locking holes 9A in the other side surface part.

As described above, according to Embodiment 1, the structure for holding a display module includes: the display module 2; the housing member 3 that is a box-like member which houses the display module 2, has the openings 3a in the surface facing the display surface of the display module 2 housed therein, and has the locking holes 9 in the side surface parts 3c; and the plate-like member 6 that is a plate-like member which is arranged on the rear surface of the display module 2 housed in the housing member 3, has the engagement claws 8 protruding outward on the edge side part and has on the plane part elastic holding pieces 7 which press the display module 2 from the rear surface side, and locks the engagement claws 8 fitted in the locking holes 9 by reaction force of pressing by the elastic holding pieces 7.

With such a configuration, the side surface parts 3c of the housing member 3 are simply bent outward, and the engagement claws 8 are simply fitted in the locking holes 9, so that the plate-like member 6 can be mounted on the housing member 3, and the assembly workability is improved. Additionally, the elastic holding pieces 7 press the display module 2 from the rear surface side, and therefore the display module 2 is strongly fixed to the housing member 3, and reliability of holding the display module can be improved.

Furthermore, any screws for fixing are not used in order to hold the display module 2, and therefore metal waste such as cutting chips of screws is not generated. Consequently, it is possible to remarkably reduce a generation ratio of defects (such as a short circuit) in an inner circuit due to the metal waste. Additionally, screws are not used, and therefore consideration of a factor of detaching of a member such as looseness of the screws is not necessary.

Furthermore, because rubber is not used, no defects in an internal electronic component due to siloxane are generated. Additionally, consideration of aged deterioration of rubber is not necessary.

Additionally, according to Embodiment 1, the locking holes 9 are slits formed in the side surface parts 3c of the plate-like member 6, and the engagement claws 8 are plate-like parts that are inserted into the slits, and therefore the side surface parts 3c of the housing member 3 are simply bent outward, and the plate-like parts are simply fitted in the slits, so that plate-like member 6 is assembled in the housing member 3, and the assembly workability can be improved.

Embodiment 2

In the structure for holding a display module according to Embodiment 1, the engagement claws 8 of the plate-like member 6 are simply fitted in the locking holes 9 of the housing member 3. In a structure for holding a display module according to Embodiment 2, a key (hook) structure of hooking on the edge of an outer opening of a locking hole is given to each engagement claw. Consequently, the outward bending of side surface parts 3c of a housing member 3 is regulated, and a structure to more unlikely to cause detaching is implemented.

Figure 12:
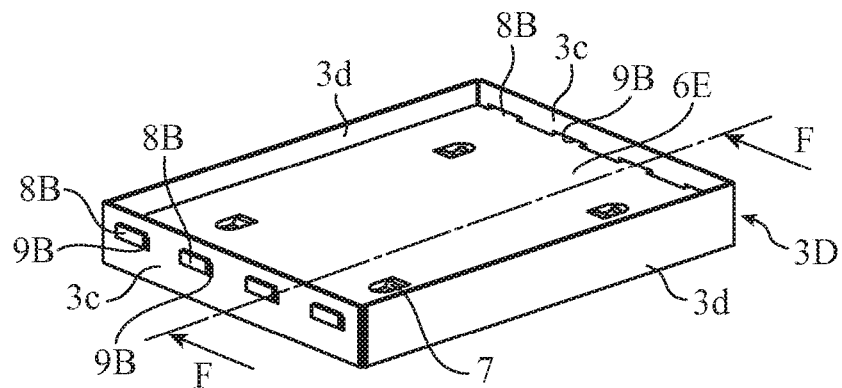
FIG. 12 is a set of figures each showing a structure for holding a display module according to Embodiment 2 of the present invention.
Figure 12:
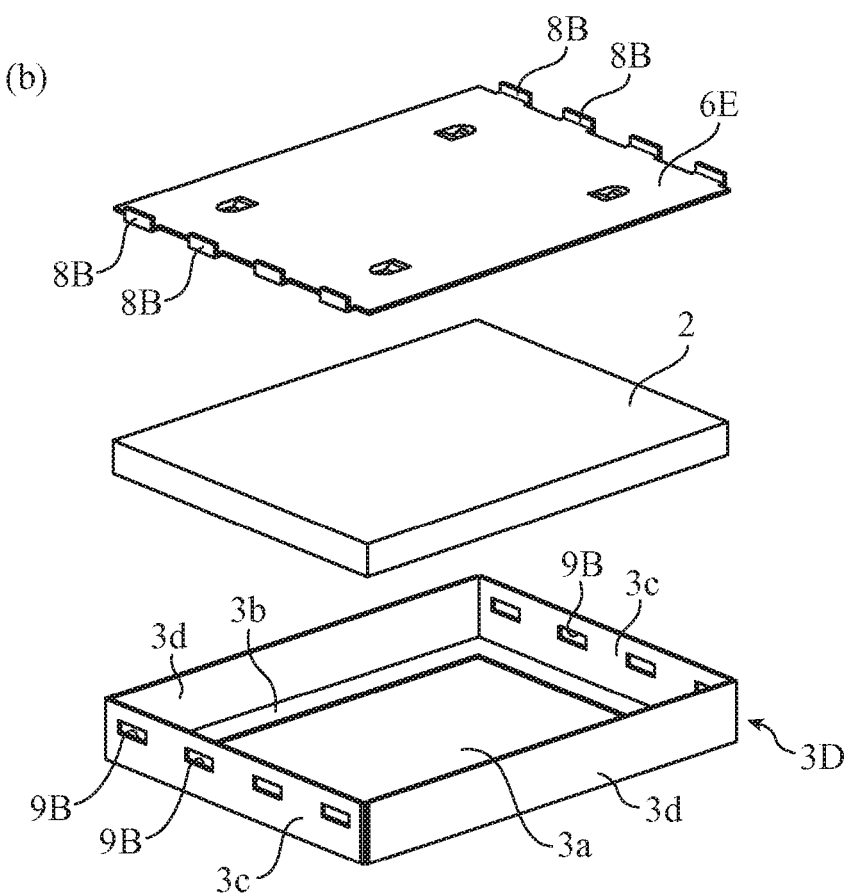

FIG. 12 is a set of figures each showing a structure for holding a display module according to Embodiment 2 of the present invention: FIG. 12(a) is a perspective view showing the display module holding structure according to Embodiment 2; and FIG. 12(b) is an exploded perspective view of the structure of FIG. 12(a).

As shown in FIG. 12(b), a plate-like member 6E is formed with engagement claws 8B on one of pairs of facing edge sides (respective edge sides facing the side surface parts 3c). The engagement claws 8B extend from the edge side parts of the plate-like member 6E, and are key-shaped claw parts, the key shapes of which are formed in an opposite direction to a surface on which elastic holding pieces 7 are provided.

As shown in FIG. 12(a), a housing member 3D is formed with locking holes 9B in each of the facing side surface parts 3c. The locking holes 9B are rectangular through holes formed by boring the side surface parts 3c, and the size of each opening in a height direction is larger than at least the size of a key portion of each engagement claw 8B in a height direction.

Figure 13:
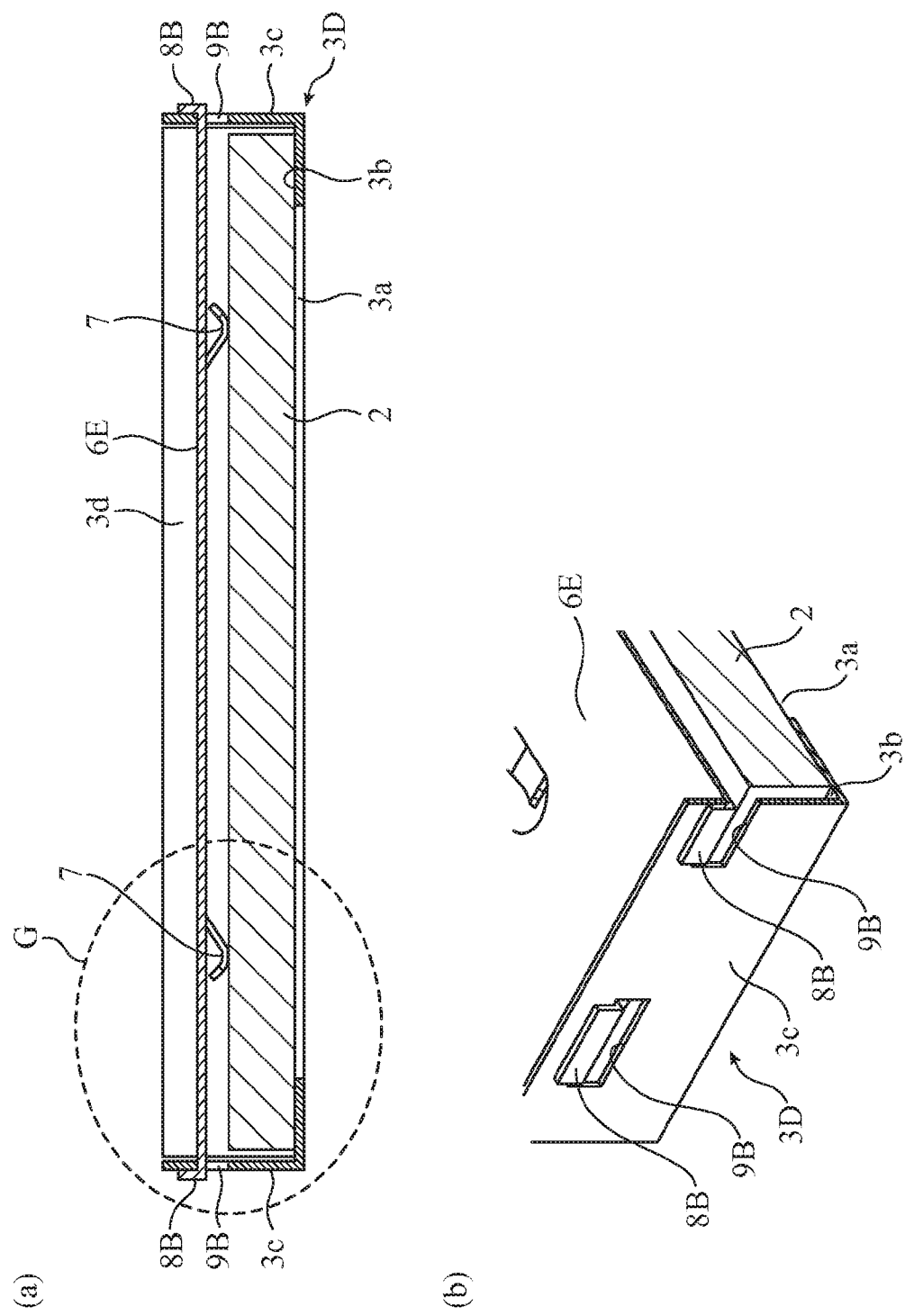
FIG. 13 is a set of sectional views taken along a line F-F of FIG. 12(a).

FIG. 13 is a set of sectional views taken along the line F-F of FIG. 12(a): FIG. 13(a) is a sectional view taken along a line F-F as viewed along arrows; and FIG. 13(b) is an enlarged perspective view of a portion G of FIG. 13(a).

As shown in FIG. 13(a), in the structure for holding a display module according to Embodiment 2, the plate-like member 6E is housed in the housing member 3D, and has no portion that directly receives external force.

In addition, as shown in FIG. 13(b), the engagement claws 8B protrude in the outward direction of the housing member 3D to be fitted and locked in the locking holes 9B. Furthermore, in the engagement claws 8B, the key portions which pass through the locking holes 9B to be exposed to the outside are hooked on the opening edges of the locking holes 9B.

Therefore, even when external force of pressing the side surface parts 3c inward from the outside is applied, the side surface parts 3c are simply bent in a direction in which the engagement claws 8B are fitted in the locking holes 9B, and the fitting and locking between the engagement claws 8B and the locking holes 9B are not easily released. Additionally, even when external force of bending the side surface parts 3c outward is applied, the key portions of the engagement claws 8B regulate the bending of the side surface parts 3c through the outer opening edges of the locking holes 9B.

Furthermore, the end surfaces of the edge side parts provided with the engagement claws 8B serve as abutting surfaces, and regulate the inward bending of the side surface parts 3c. Consequently, it is possible to improve resistance against external force of pressing the side surface parts 3c inward.

Figure 14:
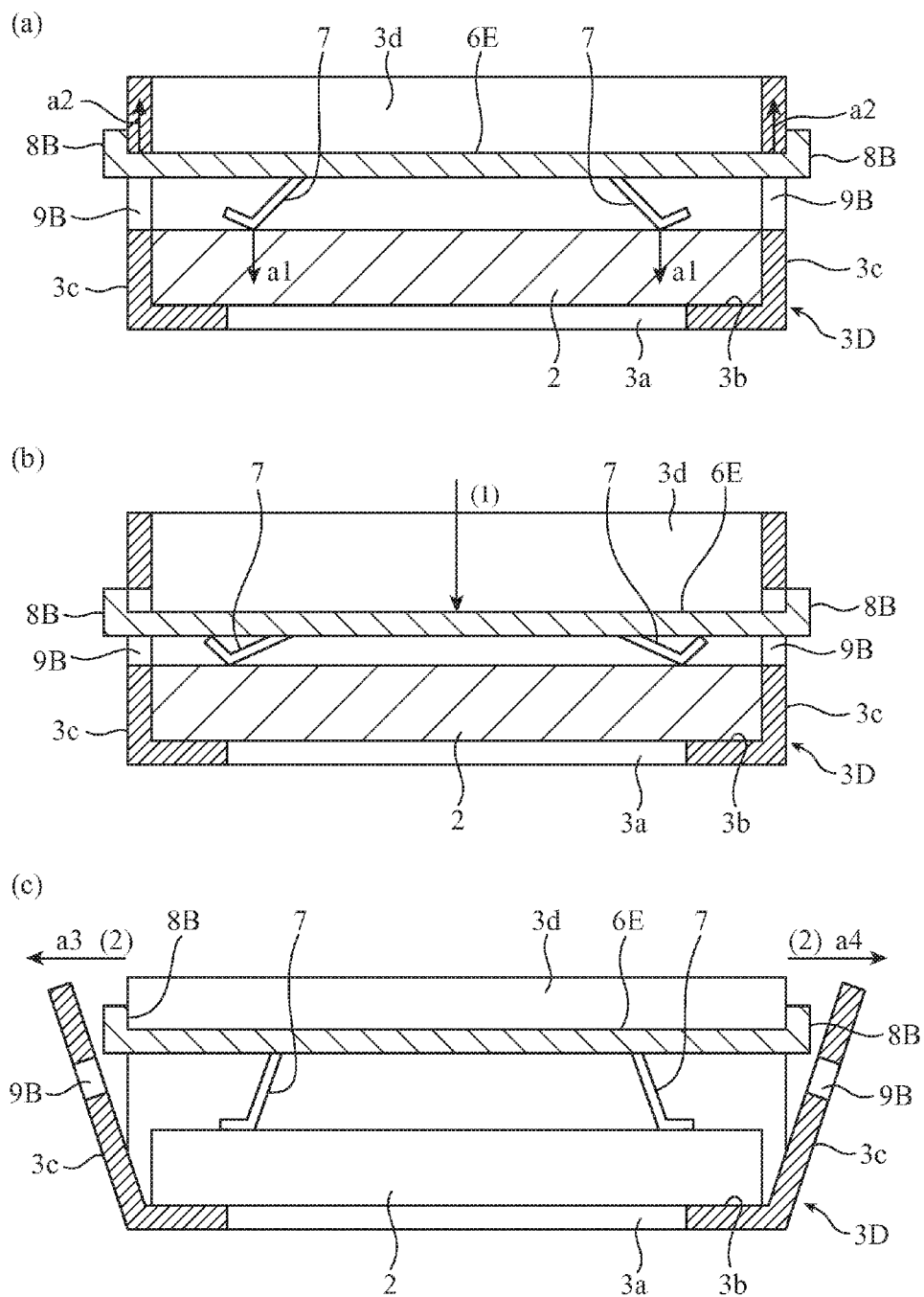
FIG. 14 is a set of figures showing an outline of holding release of the structure for holding a display module according to Embodiment 2.

FIG. 14 is a set of figures showing an outline of holding release of the structure for holding a display module according to Embodiment 2, and a holding release process proceeds from FIG. 14(a) to FIG. 14(c).

As shown in FIG. 14(a), the elastic holding pieces 7 of the plate-like member 6E press the rear surface side of the display module 2 in a direction a1, and the engagement claws 8B press the inner wall parts of the locking holes 9 in a direction a2 by the reaction force, to be locked. That is, also in the structure for holding a display module according to Embodiment 2, the plate-like member 6E is fixed to the housing member 3D by reaction force in an opposite direction (direction a2) to pressing force in the direction a1 of the elastic holding pieces 7 that is force of holding the display module 2.

In order to detach the plate-like member 6E from the housing member 3D, as shown in FIG. 14(b), until the hooking of the key portions of the engagement claws 8B is released from the opening edges of the locking holes 9B, the plate-like member 6E is first pressed down toward the display module 2.

Then, while the plate-like member 6E is pressed down in order to maintain the above state, the side surface parts 3c are bent outward (direction a3 and direction a4), and the fitting and locking between the engagement claws 8B and the locking holes 9B is released, as shown in FIG. 14(c).

As mentioned above, in Embodiment 2, it is necessary to apply force (force in the direction a3 and the direction a4) in a direction opposite to the direction (direction a2) of force of fixing the plate-like member 6E to the housing member 3D to the side surface parts 3c to bend the side surface parts 3c, while applying force (force in the direction a1) in an opposite direction to the direction (direction a2) of the force of fixing the plate-like member 6E to the housing member 3D. Accordingly, even when external force in one direction is applied to the side surface parts 3c, the plate-like member 6E is not easily detached from the housing member 3D, and assembly reliability in an actual use environment can be improved.

As described above, according to Embodiment 2, the engagement claws 8B are key-shaped claw parts hooked on the outer opening edges of the locking holes 9B, and therefore the side surface parts 3c of the housing member 3D are simply bent outward, and the engagement claws 8B are simply fitted in the locking holes 9B, so that the plate-like member 6E can be mounted on the housing member 3D, and the assembly workability is improved. Additionally, the key portions of the engagement claws 8B are hooked on the outer opening edges of the locking holes 9B, and therefore the plate-like member 6E is detached from the housing member 3D only when force in a direction in which this hooking is released is applied to the plate-like member 6E, and outward force is applied to the side surface parts 3c of the housing member 3D at the same time. Therefore, it is possible to improve reliability of holding the display module.

Additionally, any screws for fixing are not used in order to hold the display module 2, and therefore metal waste such as cutting chips of screws is not generated. Consequently, it is possible to remarkably reduce a generation ratio of defects (such as a short circuit) in an inner circuit due to the metal waste. Screws are not used, and therefore consideration of a factor of detaching of a member such as looseness of the screws is not necessary.

Furthermore, because rubber is not used, no defects in an internal electronic component due to siloxane are generated. Additionally, consideration of aged deterioration of rubber is not necessary.

Incidentally, in Embodiment 2, there is shown a case where the engagement claws 8B are the key-shaped claw parts, the key shapes of which are formed in the opposite direction to the surface on which the elastic holding pieces 7 are provided; however, it is not limited to this. For example, the engagement claws 8B may be horizontal key-shaped engagement claws, and the locking holes may be oblong holes. In this case, while force in a direction in which the plate-like member is horizontally shifted is applied, force of bending the side surface parts 3c outward is applied, so that the plate-like member can be detached from the housing member.

Embodiment 3

This structure for holding a display module according to Embodiment 3 newly includes a box-like member that covers a plate-like member housed in a housing member and the peripheral side part of the housing member.

Figure 15:
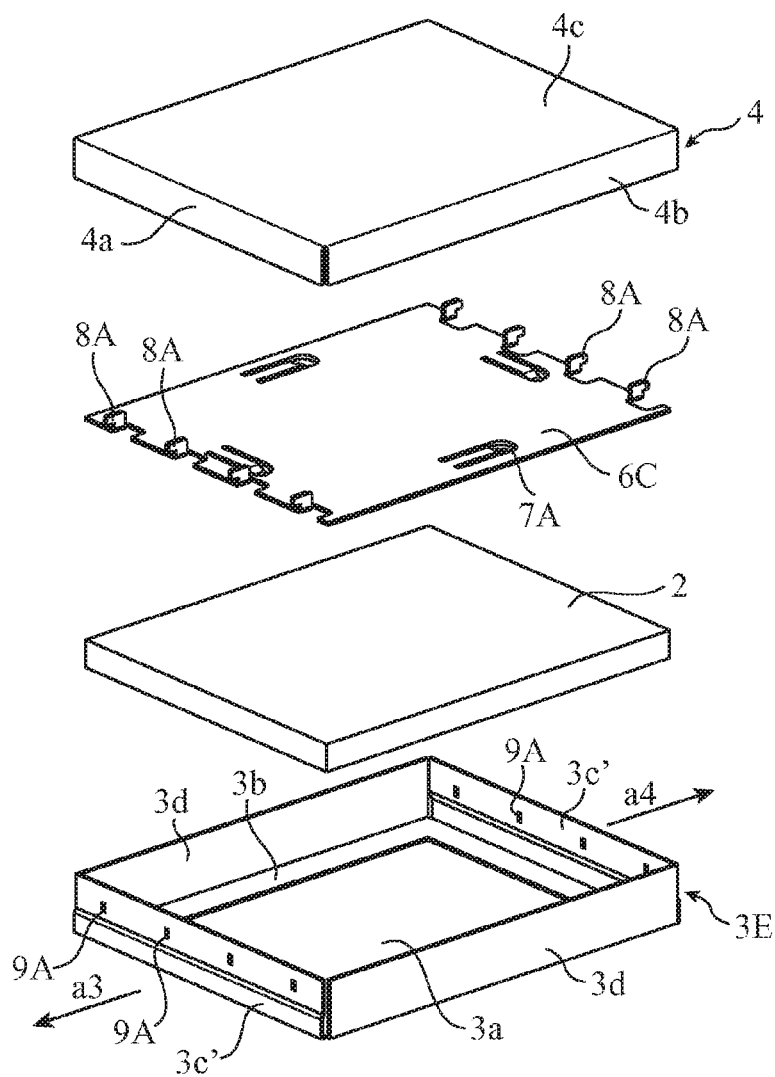
FIG. 15 is a set of figures each showing a structure for holding a display module according to Embodiment 3 of the present invention.
Figure 15:
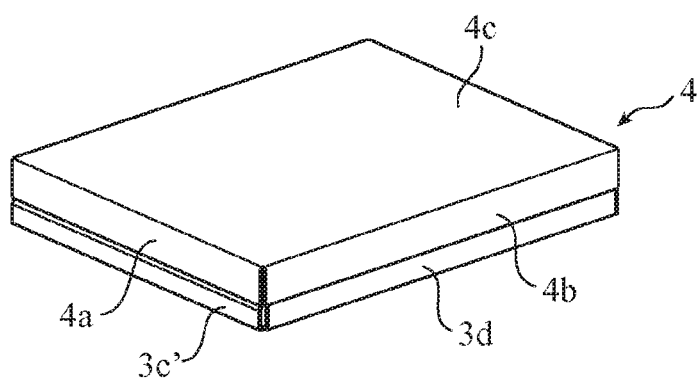

FIG. 15 is a set of figures each showing the structure for holding a display module according to Embodiment 3 of the present invention: FIG. 15(a) is an exploded perspective view of the display module holding structure according to Embodiment 3; and FIG. 15(b) is a perspective view after assembly of FIG. 15(a). As shown in FIG. 15(a), a box-like member 4 is a member having side surface parts 4a and 4b, and a top surface part 4c. In addition, a housing member 3E is formed with locking holes 9A in the upper end part of side surface parts 3c'.

Note that the side surface parts 3c' are stepped surfaces having upper end parts that lower inward such that the side surface parts 4a of the box-like member 4 do not collide (interfere) with engagement claws 8A exposed from the locking holes 9A.

In order to house a plate-like member 6C in the housing member 3E, a display module 2 is first arranged in the housing member 3E, the side surface parts 3c' of the housing member 3E are then bent outward (in the direction a3 and direction a4), and the engagement claws 8A are fitted in the locking holes 9A. Consequently, elastic holding pieces 7A press the display module 2 from the rear surface side, the engagement claws 8A fitted in the locking holes 9A are locked by reaction force of this pressing, and the display module 2 is held in the housing member 3E.

The box-like member 4 is mounted in this state, so that the box-like member 4 covers the plate-like member 6C housed in the housing member 3E, and the peripheral side part of the housing member 3E, as shown in FIG. 15(b).

On the other hand, in order to detach the plate-like member 6C from the housing member 3E, it is necessary to bend the side surface parts 3c' of the housing member 3E outward to detach the engagement claws 8A from the locking holes 9A after the box-like member 4 is detached.

As mentioned above, in the example of FIG. 15, the engagement claws 8A exposed from the locking holes 9A are covered with the side surface parts 4a of the box-like member 4, and therefore external force is not directly applied to the fitting portions between the engagement claws 8A and the locking holes 9A, and resistance against the external force can be improved. Additionally, an inconvenience in which the engagement claws 8A exposed from the locking holes 9A are caught by other components can be prevented.

Furthermore, the side surface parts 4a of the box-like member 4 regulate the outward bending movement (in the direction a3 and direction a4) of the side surface parts 3c', and therefore the plate-like member 6C is prevented from being accidentally detached from the housing member 3E due to external force, vibration, or the like, and reliability of holding the display module can be remarkably improved.

Figure 16:
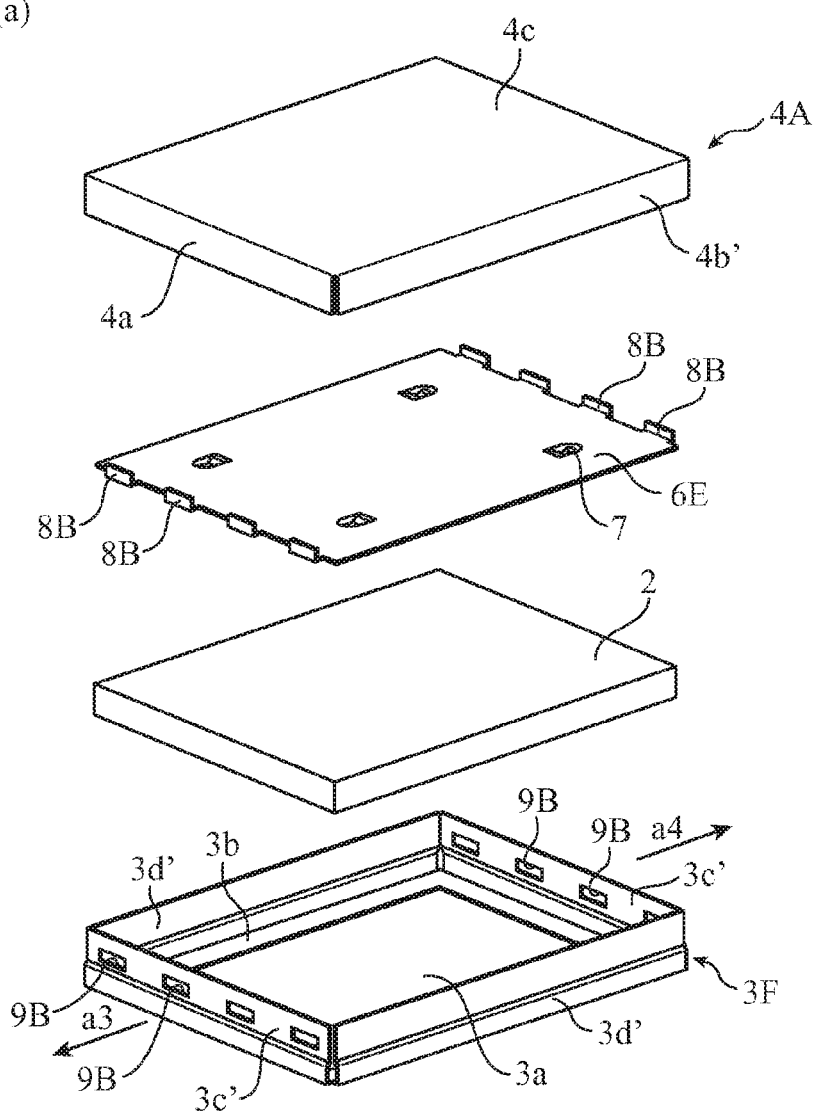
FIG. 16 is a set of figures each showing another example (Example 1) of the structure for holding a display module according to Embodiment 3.
Figure 16:
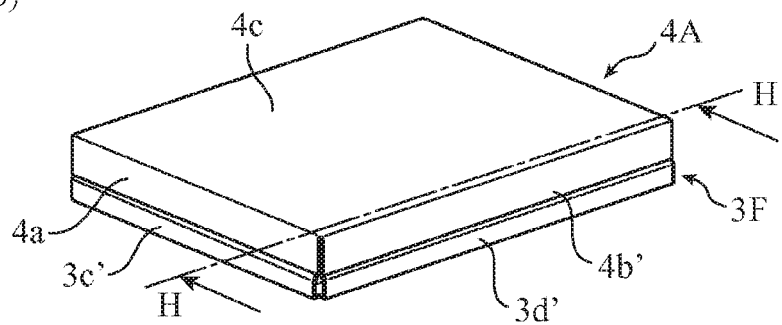

FIG. 16 is a set of figures each showing another example (Example 1) of the structure for holding a display module according to Embodiment 3: FIG. 16(a) is an exploded perspective view of a display module holding structure of Example 1; and FIG. 16(b) is a perspective view after assembly of FIG. 16(a). In the structure shown in FIG. 16, a plate-like member 6E is used, and a housing member 3F is formed with locking holes 9B in the upper end parts of side surface parts 3c'.

In order to house the plate-like member 6E in the housing member 3F, a display module 2 is first arranged in the housing member 3F. At this time, the peripheral edge part of the display surface of the display module 2 is supported by a flange 3b. Then, the side surface parts 3c' of the housing member 3F are bent outward (in the direction a3 and direction a4), and engagement claws 8B are fitted in the locking holes 9B. Consequently, elastic holding pieces 7 presses the display module 2 from the rear surface side, the engagement claws 8B fitted in the locking holes 9B are locked by reaction force of this pressing, and the display module 2 is held in the housing member 3F.

The box-like member 4A is mounted in this state, so that a box-like member 4A covers the plate-like member 6E housed in the housing member 3F, and the peripheral side part of the housing member 3F, as shown in FIG. 16(b).

On the other hand, in order to detach the plate-like member 6E from the housing member 3F, the box-like member 4A is first detached, and the side surface parts 3c' of the housing member 3F are bent outward to detach the engagement claws 8B from the locking holes 9B, while the plate-like member 6E is pressed down until the hooking of the key portions of the engagement claws 8B are released from the opening edges of the locking holes 9B.

Figure 17:
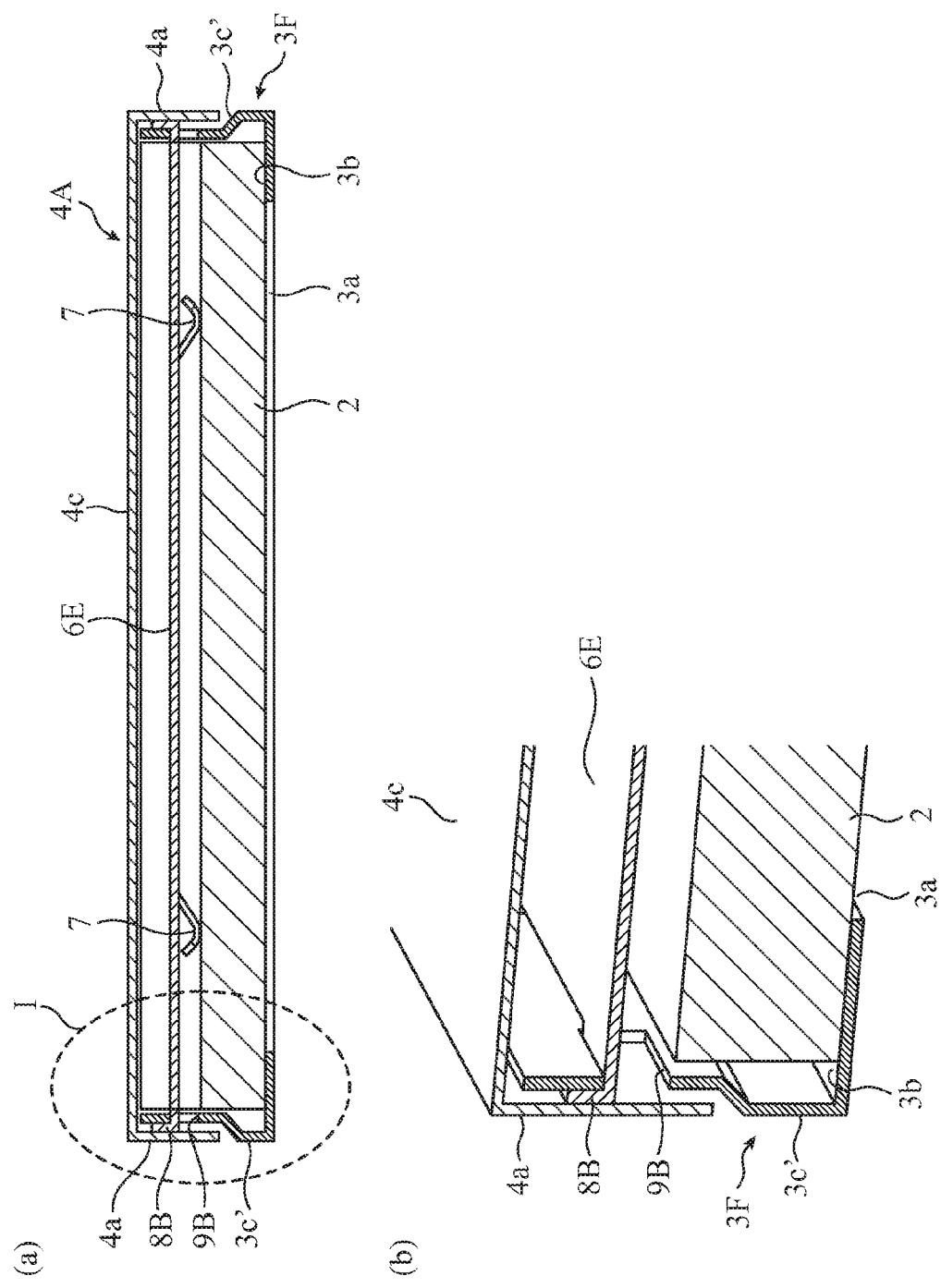
FIG. 17 is a set of sectional views taken along a line H-H of FIG. 16(b).

FIG. 17 is a set of sectional views taken along a line H-H of FIG. 16(a): FIG. 17(a) is a sectional view taken along a line H-H as viewed along arrows; and FIG. 17(b) is an enlarged perspective view of a portion I of FIG. 17(a).

Additionally, the box-like member 4A has an opening area smaller than that of the box-like member 4 of FIG. 15. In accordance with this, when assembled to the box-like member 4A, the housing member 3F is provided with side surface parts 3c' and 3d' that are formed as stepped surfaces having upper end parts that lower inward, such that the inner surfaces of the side surface parts 4a of the box-like member 4A come into contact with key portions of the engagement claws 8B hooked on the opening edges of the locking holes 9B, and that the side surface parts 4b of the box-like member 4A come into contact with the housing member 3d'.

With such a configuration, the key portions of the engagement claws 8B hooked on the opening edges of the locking holes 9B are covered with the side surface parts 4a of the box-like member 4A, and therefore external force is not directly applied to the fitting portions between the engagement claws 8B and the locking holes 9B, and resistance against the external force can be improved.

Additionally, the key portions of the engagement claws 8B exposed from the locking holes 9B can be prevented from being caught by other components.

Furthermore, the side surface parts 4a of the box-like member 4A regulate an outward bending movement (in the direction a3 and direction a4) of the side surface parts 3c', and therefore the plate-like member 6E is prevented from being accidentally detached from the housing member 3F due to application of external force, vibration, or the like, and reliability of holding the display module can be remarkably improved.

As described above, according to Embodiment 3, the box-like member 4 that covers the plate-like member 6C housed in the housing member 3E, and the peripheral side part 3c' of the housing member 3E is provided, for example as shown in FIG. 15, and therefore, similarly to Embodiments 1 and 2, the side surface parts 3c of the housing member 3E are simply bent outward, and the engagement claws 8A are simply fitted in the locking holes 9A, so that the plate-like member 6C can be mounted on the housing member 3E, and the assembly workability is improved.

In addition, external force is not directly applied to the fitting portions between the engagement claws 8A and the locking holes 9A by the side surface parts 4a of the box-like member 4, and resistance against the external force can be improved. Additionally, an inconvenience where the engagement claws 8A exposed from the locking holes 9A are caught by other components can be prevented.

Further, the side surface parts 4a of the box-like member 4 regulate the outward bending movement (in the direction a3 and direction a4) of the side surface parts 3c', and therefore the plate-like member 6C is prevented from being accidentally detached from the housing member 3E due to external force, vibration, or the like, and reliability of holding the display module can be remarkably improved.

Furthermore, any screws for fixing are not used in order to hold the display module 2, and therefore metal waste such as cutting chips of screws is not generated. Consequently, it is possible to remarkably reduce a generation ratio of defects (such as a short circuit) in an inner circuit due to the metal waste. Screws are not used, and therefore consideration of a factor of detaching of a member such as looseness of the screws is not necessary.

Moreover, because rubber is not used, no defects in an internal electronic component due to siloxane are generated. Additionally, consideration of aged deterioration of rubber is not necessary.

Embodiment 4

In the structures of Embodiments 1 to 3, it is assumed that the side surface parts provided with the locking holes of the housing member have flexibility. In Embodiment 4, there is shown a structure to be applied to a case where a housing member is formed from a material having high rigidity, which makes it impossible to bend side surface parts.

Figure 18:
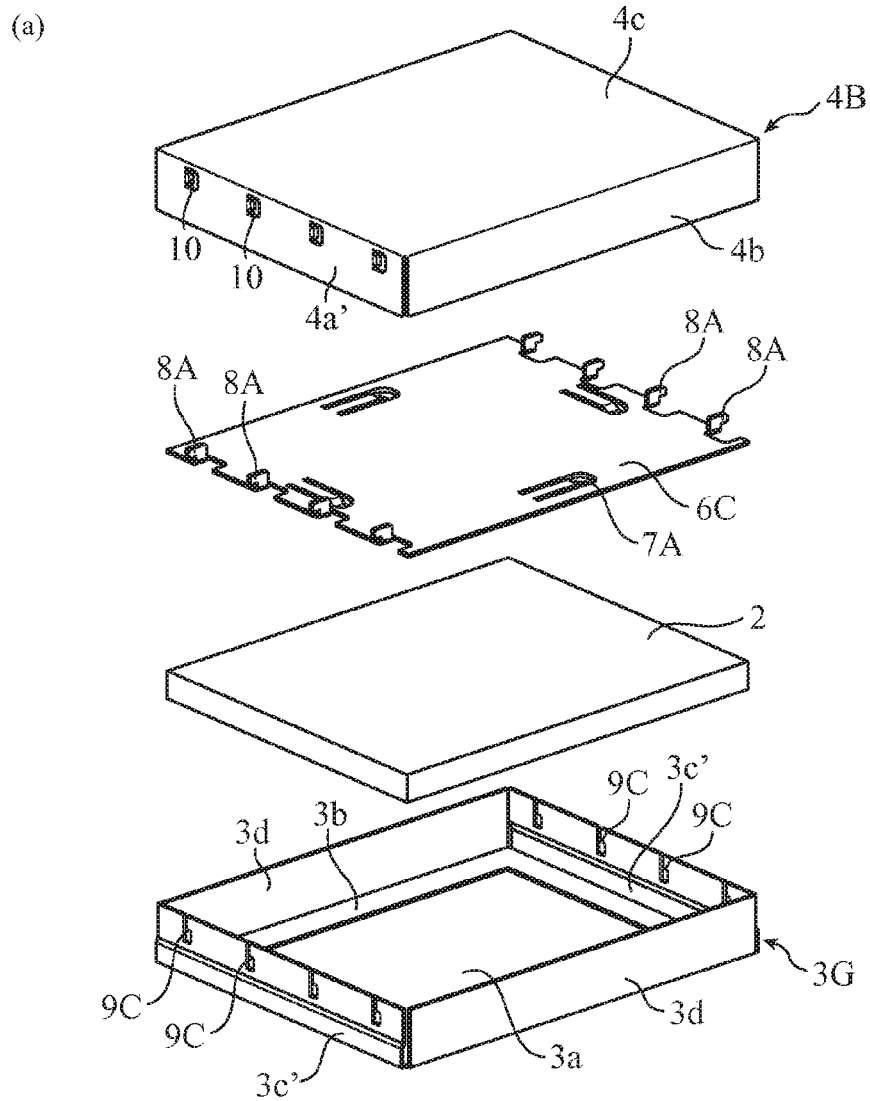
FIG. 18 is a set of figures each showing a structure for holding a display module according to Embodiment 4 of the present invention.
Figure 18:
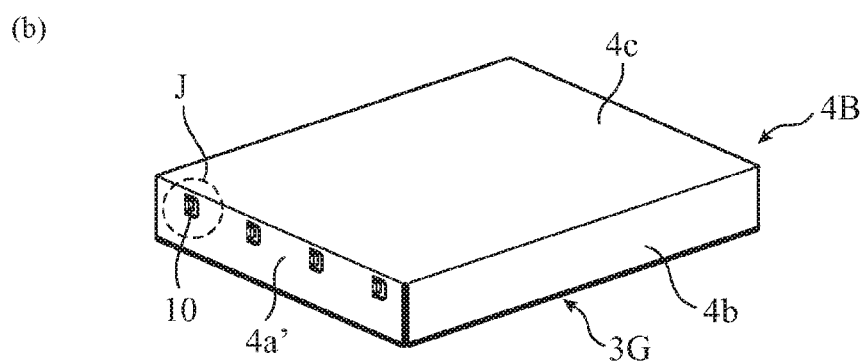

FIG. 18 is a set of figures each showing a structure for holding a display module according to Embodiment 4: FIG. 18(a) is an exploded perspective view of the display module holding structure according to Embodiment 4; and FIG. 18(b) is a perspective view after assembly of FIG. 18(a). In the structure shown in FIG. 18, a plate-like member 6C is used. A housing member 3G has rigidity which does not allow bending of side surface parts 3c', and is formed with locking holes 9C in the side surface parts 3c'.

As shown in FIG. 18(a), the locking holes 9C are slits formed by opening the upper end surface side of the side surface parts 3c' of the housing member 3G. In addition, a box-like member 4B is formed with coming-off prevention pieces 10 on side surface parts 4a' facing the side surface parts 3c' of the housing member 3G, when being assembled to the housing member 3G.

In order to house the plate-like member 6C in the housing member 3G, a display module 2 is first arranged in the housing member 3G. At this time, the peripheral edge part of the display surface of the display module 2 is supported by a flange 3b. Then, engagement claws 8A are inserted from upper opening ends of the locking holes 9C, and the plate-like member 6C is housed in the housing member 3G.

The box-like member 4B is mounted while the coming-off prevention pieces 10 are inserted from the upper opening ends of the locking holes 9C in this state, so that the box-like member 4B covers the plate-like member 6C housed in the housing member 3G, and the peripheral side part of the housing member 3G, as shown in FIG. 18(b). Thereafter, the housing member 3G is fixed to the box-like member 4B in some way (such as fitting and fixing by claws, or fixing by a tape), so that the display module 2 is held in the housing member 3G in a state where the engagement claws 8A fitted in the locking holes 9C are locked.

On the other hand, when the plate-like member 6C is detached from the housing member 3G, the box-like member 4B is first detached, and the engagement claws 8A are moved until the engagement claws 8A come off from the upper opening ends of the locking holes 9C, and the plate-like member 6C is detached from the housing member 3G.

Figure 19:
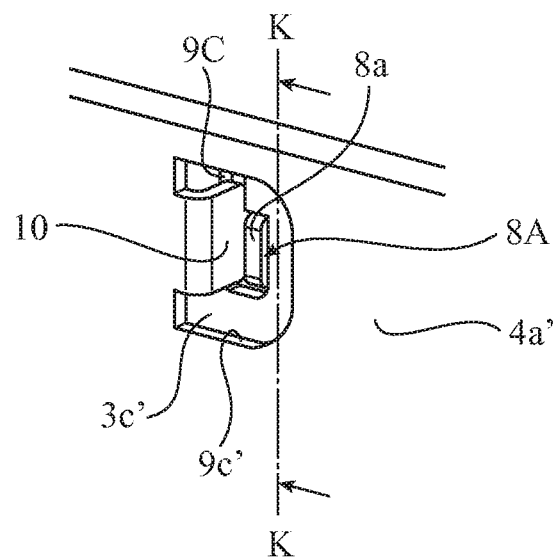
FIG. 19 is a set of enlarged views of a portion J of FIG. 18(a).
Figure 19:
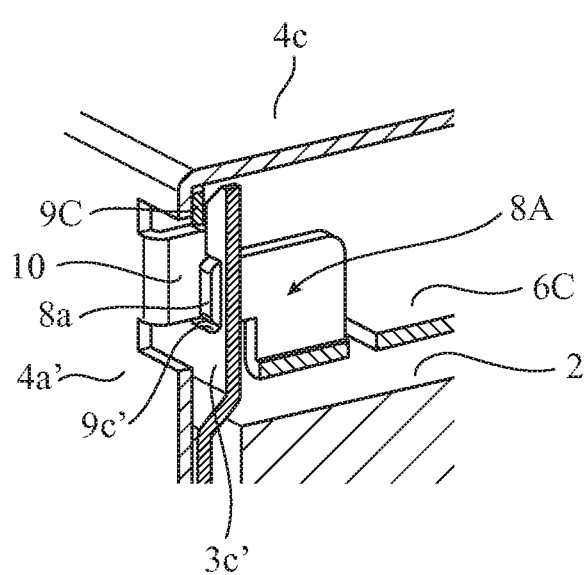

FIG. 19 is an enlarged view of a portion J of FIG. 18(a): FIG. 19(a) is an enlarged perspective view of the portion J; and FIG. 19(b) is a sectional view taken along a line K-K as viewed along arrows. As shown in FIG. 19(a), each locking hole 9C has a two-step slit structure in which the slit width at a lower step is wider than that of the upper opening end. As shown in FIG. 19(b), a lower step slit part 9C' is formed so as to have a slit width allowing a plate-like part 8a of the engagement claw 8A and the coming-off prevention piece 10 to be arranged side by side. The plate-like part 8a of the engagement claw 8A is locked at a position away from the slit that is continuous from the upper opening end in the slit part 9C' by reaction force of the pressing of the display module 2. The coming-off prevention piece 10 is fitted up to a position adjacent to the plate-like part 8a of the engagement claw 8A in this state, so that the coming-off prevention piece 10 serves as a coming-off prevention part of the plate-like part 8a of the engagement claw 8A.

Figure 20:
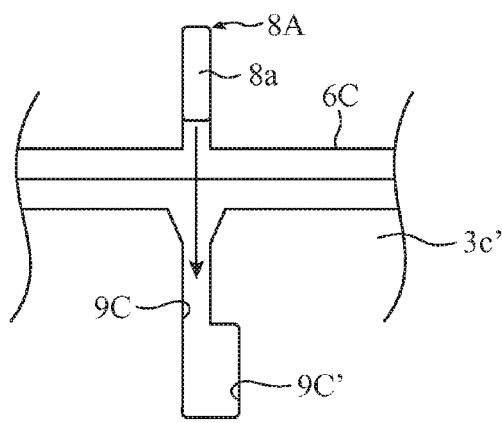
FIG. 20 is a set of figures schematically showing a structure of assembling a plate-like member and a box-like member to a housing member in the structure for holding a display module according to Embodiment 4.
Figure 20:
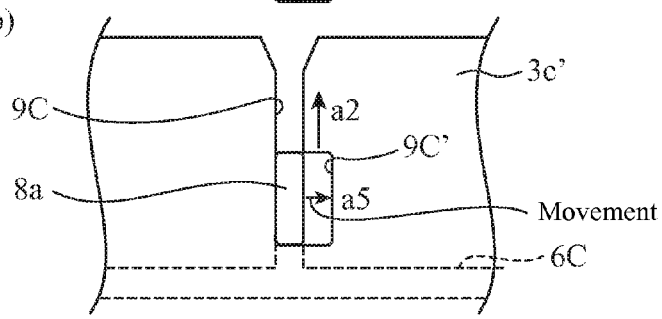
Figure 20:
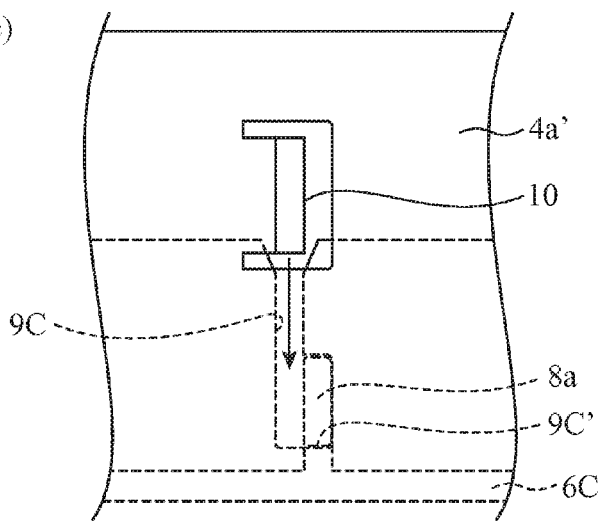
Figure 20:
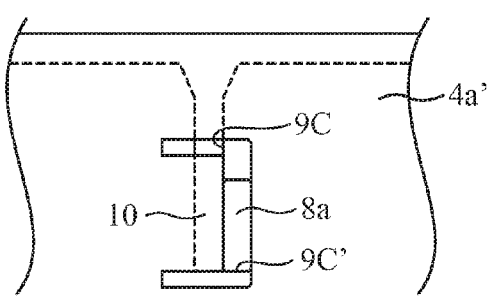

FIG. 20 is a set of figures schematically showing a structure of assembling the plate-like member and the box-like member to the housing member in the structure for holding a display module according to Embodiment 4, as the assembling places are viewed from the front. Additionally, assembling processes proceed FIG. 20(a) to FIG. 20(d).

First, as shown in FIG. 20(a), the plate-like part 8a of the engagement claw 8A of the plate-like member 6C is inserted from the opening end of the locking hole 9C.

After the plate-like part 8a reaches the position of the slit part 9C', the plate-like member 6C moves in the direction a5, and the plate-like part 8a is arranged at the position away from the slit that is continuous from the upper opening end, as shown in FIG. 20(b). At this time, the plate-like part 8a is pressed upward (in a direction a2) at the above position of the slit part 9C' to be thus locked by the reaction force of pressing the display module 2 with the elastic holding pieces 7A.

Then, as shown in FIG. 20(c), the box-like member 4B is mounted, while the coming-off prevention piece 10 is inserted from the upper opening ends of the locking holes 9C. When the coming-off prevention piece 10 reaches the slit part 9C', the coming-off prevention piece 10 and the plate-like part 8a of the engagement claw 8A are arranged side by side, as shown in FIG. 20(d). Consequently, unless the box-like member 4B is detached, the plate-like part 8a of the engagement claw 8A is not detached from the slit part 9C'. Accordingly, the plate-like member 6C is prevented from being accidentally detached from the housing member 3G due to external force, vibration, or the like, and reliability of holding the display module can be remarkably improved.

Incidentally, in the above description, there is shown a case where each coming-off prevention piece 10 is fitted up to a position at which the coming-off prevention piece 10 and the plate-like part 8a of the engagement claw 8A are arranged side by side by the slit part 9C'; however, it is not limited to this. For example, the slit width from the opening end of the locking hole is not changed, and the length of the slit is increased. In this structure, the coming-off prevention piece 10 presses the plate-like part 8a of the engagement claw 8A fitted up to the lower end of the slit, from above. With such a configuration, this structure can obtain an effect similar to the above.

As described above, according to Embodiment 4, the locking holes 9C are slits opened to the end surfaces of the side surface parts 3c' of the housing member 3G, and the box-like member 4B has the coming-off prevention pieces 10 that prevent the coming-off of the engagement claws 8A by further fitting the box-like member 4B in the locking holes 9C, in which the engagement claws 8A have been fitted and locked, on the side surface parts 4a'. Therefore, the plate-like parts 8a of the engagement claws 8A are fitted into the locking holes 9C that are slits formed in the side surface parts 3c' of the housing member 3G, and the coming-off prevention pieces 10 of the box-like member 4B then simply prevent the coming-off, so that the plate-like member 6C can be mounted on the housing member 3G, thereby improving the assembly workability.

In addition, the coming-off prevention pieces 10 provided in the side surface parts 4a' of the box-like member 4B prevent the coming-off of the engagement claws 8A fitted in the locking holes 9C, and therefore unless the box-like member 4B is detached, the plate-like member 6C is not detached from the housing member 3G, so that the reliability of holding the display module can be remarkably improved.

Further, any screws for fixing are not used in order to hold the display module 2, and therefore metal waste such as cutting chips of screws is not generated. Consequently, it is possible to remarkably reduce a generation ratio of defects (such as a short circuit) in an inner circuit due to the metal waste. Because screws are not used, consideration of a factor of detaching of a member such as looseness of the screws is not necessary.

Furthermore, because rubber is not used, no defects in an internal electronic component due to siloxane are generated. Additionally, consideration of aged deterioration of rubber is not necessary.

Embodiment 5

Figure 21:
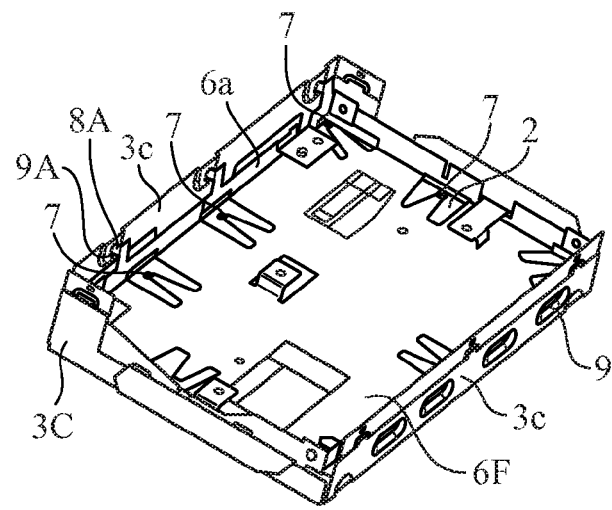
FIG. 21 is a set of figures each showing a configuration of a structure for holding a display module according to Embodiment 5 of the present invention.
Figure 21:
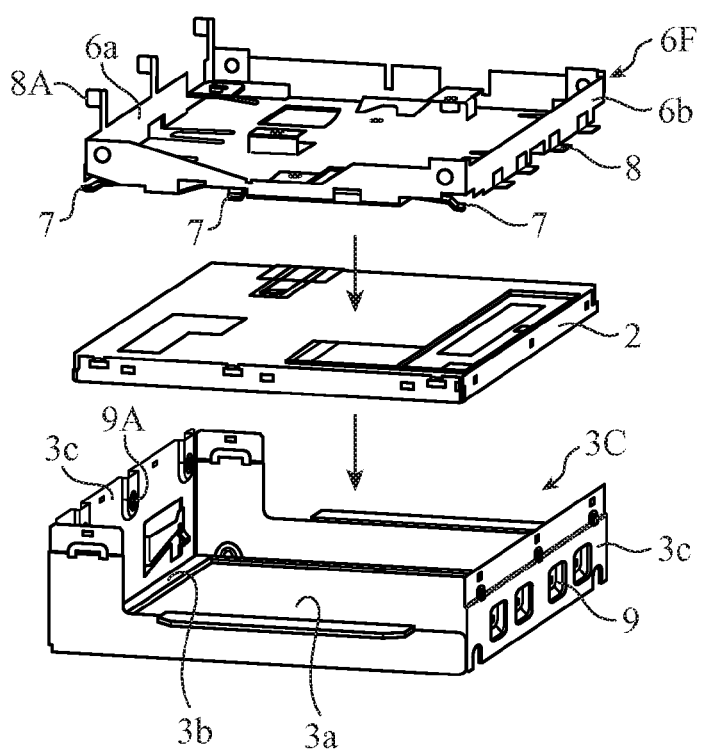

FIG. 21 is a set of figures each showing a configuration of a structure for holding a display module according to Embodiment 5 of the present invention: FIG. 21(a) is a perspective view showing the display module holding structure according to Embodiment 5; and FIG. 21(b) is an exploded perspective view of the structure of FIG. 21(a). As shown in FIG. 21(a), a display module 2 is housed in a housing member 3C while being pressed from the rear surface side by elastic holding pieces 7 of a plate-like member 6F.

As shown in FIG. 21(b), the housing member 3C is formed with an opening 3a in a surface facing the display surface of the display module 2 housed therein, and further has locking holes 9 in one of facing side surface parts 3c, and locking holes 9A in the other facing side surface part. The locking holes 9 are oblong slits, in which engagement claws 8 are fitted. Additionally, the locking holes 9A are longitudinal slits in which engagement claws 8A are fitted.

As shown in FIG. 21(a), the plate-like member 6F is formed with the elastic holding pieces 7 on portions along the edge side of the plane part and four corners thereof.

Additionally, in the plate-like member 6F, the edge side part 6a is vertically bent to the opposite side to the surface having the elastic holding pieces 7, and the edge side part 6b facing the edge side part 6a is also vertically bent to the opposite side to the surface having the elastic holding pieces 7.

The engagement claws 8A are formed on the edge side of the edge side part 6a of the plate-like member 6F, and the engagement claws 8 are formed on the bases connected to the plane part of the edge side part 6b.

Additionally, the engagement claws 8 are oblong plate-like parts, and are fitted in the locking holes 9. The engagement claws 8A are longitudinal plate-like parts, and are fitted in the locking holes 9A.

In a state where the elastic holding pieces 7 press the display module 2 from the rear surface side, the engagement claws 8 are fitted into the locking holes 9, and the engagement claws 8A are fitted in the locking holes 9A, so that the engagement claws 8 fitted in the locking holes 9 are locked, and the engagement claws 8A fitted in the locking holes 9A are locked by reaction force of pressing by the elastic holding pieces 7. Consequently, the plate-like member 6F holds the display module 2 in the housing member 3C. Additionally, in the plate-like member 6F, the engagement claws 8 and 8A are fitted and locked; thus, the edge side part 6a overlaps with the inner surface of the housing member 3C such that a fold of the edge side part 6a matches that of the inner surface, and similarly, the edge side part 6b overlaps with the inner surface of the housing member 3C such that a fold of the edge side part 6b matches that of the inner surface. Consequently, this state is similar to a state where each side surface part is doubled, and resistance against external force can be remarkably improved compared to the structure in which folds do not overlap with each other as disclosed in Patent Document 1.

As described above, according to Embodiment 5, the plate-like member 6F has the engagement claws 8A in the edge side part 6a bent to the opposite side to the surface having the elastic holding pieces 7, and the edge side part 6a is housed in the housing member 3C such that the edge side part 6a overlaps with the inner surface of the housing member 3C with the fold of the edge side part 6a matching that of the inner surface, when the engagement claws 8A are fitted and locked in the locking holes 9A. With such a configuration, it is possible to improve resistance against external force.

Incidentally, the present invention can be implemented by free combination of the respective embodiments, modification of arbitrary components of the respective embodiments, or omission of arbitrary components of the respective embodiments, within the scope of the invention.

INDUSTRIAL APPLICABILITY

Since the structure for holding a display module according to the present invention has excellent assembly workability, and can improve the reliability of holding the display module, it is suitable for, for example, an on-vehicle display apparatus to which vibration is easily transmitted by traveling of a vehicle.

DESCRIPTION OF REFERENCE NUMERALS AND SIGNS

1: DISPLAY APPARATUS
2: DISPLAY MODULE
3, 3A TO 3G: HOUSING MEMBER
3a: OPENING
3b: FLANGE
3c, 3c', 3d, 3d': SIDE SURFACE PART
4, 4A, 4B: BOX-LIKE MEMBER
5: DISPLAY SURFACE
6, 6A TO 6F: PLATE-LIKE MEMBER
6a, 6b: EDGE SIDE PART
7, 7A: ELASTIC HOLDING PIECE
8, 8A, 8B: ENGAGEMENT CLAW
8a: PLATE-LIKE PART
8b: BASE
8c: GUIDE SURFACE
9, 9A TO 9C: LOCKING HOLE
9C': SLIT PART
10: COMING-OFF PREVENTION PIECE

The invention claimed is:

1. A structure for holding a display module comprising:
a display module;
a first member that is a box-like member which houses the display module, has an opening in a surface facing a display surface of the display module housed therein, and has a locking hole in a side surface part;
a second member that is a plate-like member which is arranged on a rear surface of the display module housed in the first member, has an engagement claw that protrudes outward on an edge side part and has on a plane part an elastic holding piece which presses the display module from a rear surface side, and locks the engagement claw that is fitted in the locking hole by reaction force of pressing by the elastic holding piece; and
a box-like third member that covers the second member housed in the first member, and a peripheral side part of the first member,
wherein the locking hole is a slit that is opened to an end surface of the side surface part of the first member, and the third member has on a side surface part a coming-off prevention piece that prevents coming-off of the engagement claw by being further fitted in the slit in which the engagement claw has been fitted and locked.

2. The structure for holding a display module according to claim 1, wherein
the engagement claw is a plate-like part that is inserted into the slit.

3. The structure for holding a display module according to claim 1, wherein
the engagement claw is a key-shaped claw part that is hooked on an outer opening edge of the locking hole.

4. The structure for holding a display module according to claim 1, wherein the second member has the engagement claw on an edge side part that is bent to an opposite side to the surface having the elastic holding piece, and is housed in the first member such that the edge side part overlaps with an inner surface of the first member with the fold of the edge side part matching the fold of the inner surface, when the engagement claw is fitted and locked in the locking holes.

\* \* \* \* \*